(12) United States Patent
Yamazaki et al.

(10) Patent No.: US 6,961,881 B2
(45) Date of Patent: Nov. 1, 2005

(54) SEMICONDUCTOR DEVICE

(75) Inventors: Masafumi Yamazaki, Kawasaki (JP); Takaaki Suzuki, Kawasaki (JP); Toshikazu Nakamura, Kawasaki (JP); Satoshi Eto, Kawasaki (JP); Toshiya Miyo, Kawasaki (JP); Ayako Sato, Kawasaki (JP); Takayuki Yoneda, Kawasaki (JP); Noriko Kawamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 463 days.

(21) Appl. No.: 10/122,181

(22) Filed: Apr. 16, 2002

(65) Prior Publication Data
US 2003/0065997 A1 Apr. 3, 2003

(30) Foreign Application Priority Data
Sep. 14, 2001 (JP) .............................. 2001-279302
Jan. 28, 2002 (JP) .............................. 2002-018455

(51) Int. Cl.[7] .......................................... G11C 29/00
(52) U.S. Cl. .................................................... 714/718
(58) Field of Search ............................... 714/718, 719, 714/724, 733, 735, 738; 365/200, 201, 145

(56) References Cited

U.S. PATENT DOCUMENTS 5,682,352 A * 10/1997 Wong et al. ................. 365/201
6,505,317 B1 * 1/2003 Smith et al. ................. 714/738

* cited by examiner

Primary Examiner—Albert Decady
Assistant Examiner—James C. Kerveros
(74) Attorney, Agent, or Firm—Arent Fox PLLC

(57) ABSTRACT

A logic chip and a memory chip to be accessed by the logic chip are mounted in a single package. A pattern generator of the logic chip operates during a first test mode to generate internal test pattern for the memory chip. A pattern selector selects, during the first test mode, the internal test pattern outputted from the pattern generator, selects, during a second test mode, an external test pattern supplied via a test terminal, and outputs the selected test pattern to the memory chip. The memory chip mounted in the package is tested by use of, in accordance with a mode selecting signal, either the internal test pattern in the first test mode, generated within the logic chip, or the external test pattern in the second test mode, supplied from the exterior.

10 Claims, 30 Drawing Sheets

| EXT | flash memory 3 | | | pseudo SRAM 4 | |
|---|---|---|---|---|---|
| | normal operation mode | | test mode | normal operation mode | test mode |
| | input to generator 6 | output from generator 6 | | | |
| DQ0-15 | DQ0-15 | → I/O0-15 | I/O0-15 | DQ0-15 | DQ0-15 |
| AD0-21 | AD0-21 | ↗ | — — | AD0-21 | AD0-21 |
| AD22 | AD22 | ALE* | ALE | AD22 | AD22 |
| AD23 | AD23 | CLE* | CLE | AD23 | AD23 |
| /CE | — — | | — — | /CE | /CE |
| /CE1 | /CE1 | ↗ /CE | /CE | /CE1 | /CE1 |
| CE2 | — — | | — — | CE2 | CE2 |
| /UB | — — | /WP* | /WP | /UB | /UB |
| /LB | — — | /SE* | /SE | /LB | /LB |
| /OE | /OE | ↗ /RE | /RE | /OE | /OE |
| /WE | /WE | ↗ /WE | /WE | /WE | /WE |

* : generating by generator 6

Fig. 24

SEMICONDUCTOR DEVICE

BACKGROUND OF THE INVENTION

1. Field of the Invention

The present invention relates to a semiconductor device wherein a plurality of chips are mounted in the same package that singly constitutes a system, and to semiconductor devices mounted in the above semiconductor device. Particularly, the present invention relates to a technique for testing the memory chip(s) mounted in the above semiconductor device.

Moreover, the present invention relates to a technique for supplying a clock signal to be used in the semiconductor chips constituting the above semiconductor device.

2. Description of the Related Art

Recently there have been developed packaging techniques for providing a semiconductor device in which a memory chip, a digita' chip, an analog chip, passive components and so on whose respective process techniques are different are accommodated in a single package that acts as a system. Particularly, a semiconductor device developed by use of a design circumstance including not only an LSI design process but also a mounting process in view of the affection of the wires between the chips is called System-In-Package (hereinafter referred to as SIP) or Multi-Chip-Package (hereinafter referred to as MCP).

The test of this kind of SIP is performed in a similar manner to the test of a conventional Multi-Chip-Module (MCM). For example, if an SIP is formed by mounting a memory chip and a logic chip, then the function test of the memory chip, that of the logic chip, and the test of the mutual connection between the memory and logic chips are performed after assembly of the SIP.

If the memory chip mounted in the SIP is accessed only by the logic chip, the terminals of the memory chip need not be connected to the external terminals of the SIP. In such a case, the memory chip is tested via the logic chip. In such a case, however, the memory chip test is performed by setting a variety of data in the logic chip, disadvantageously resulting in a long test time. The length of the test time directly affects the manufacturing cost.

Besides, if a variety of data are set in the logic chip to thereby allow the logic chip to produce signals for accessing the memory chip, the test program used in testing memory chips separately cannot be used. The test program used in testing memory chips separately may be used, for example, in a proof test for testing a plurality of memory chips formed on a wafer.

Conventionally, in order to deal with the above problems, even in a case when the memory chip was accessed only by the logic chip, the terminals of the memory chip mounted in the SIP were connected to the external terminals of the SIP. In this way, the memory chip can be directly accessed from the SIP exterior even after assembly of the SIP, and hence the time required to test the functions of the memory chip can be reduced.

However, if the terminals of the memory chip are connected to the external terminals of the SIP, then the numbers of the terminals and wires within the SIP are increased. For example, in a case when the memory chip and logic chip are mounted on the system board, the numbers of the wires and terminals formed in the system board are increased. This disadvantageously increases the size and manufacturing cost of the SIP.

Moreover, since the wires unnecessary for the normal operation (i.e., the operation of a shipped product) are connected to the memory chip, a signal delay, characteristic degradation or other problems will occur due to the extra loads.

On the other hand, a technique has been developed in which a test circuit for performing a built-in self test (BIST) is formed in the memory chip and is controlled from the logic chip, thereby allowing the memory chip to be tested even after assembly of the SIP. However, this test circuit cannot test the interface between the logic and memory chips which is used during the normal operation.

SUMMARY OF THE INVENTION

It is an object of the present invention to ensure that the memory chip mounted in an SIP (or MCP) is tested without increasing the costs of the semiconductor device formed as the SIP and the semiconductor devices mounted in the SIP.

It is another object of the present invention to prevent any loads of the wires for a test from affecting the system operations within the SIP.

It is another object of the present invention to reduce the cost required to develop a test program for a memory chip mounted in a semiconductor device.

It is another object of the present invention to supply an optimum clock signal to a logic chip in the semiconductor device in which a plurality of memory chips and the logic chip that controls these memory chips are mounted.

According to one of the aspects of the semiconductor device of the present invention, a semiconductor device is formed by mounting, in a single package, a logic chip and a memory chip to be accessed by the logic chip. That is, the semiconductor device is formed as a System-In-Package (hereinafter referred to as SIP) or a Multi-Chip-Module (hereinafter referred to as MCM). A semiconductor device has a memory connection terminal connected to a terminal of a memory chip mounted in the same package as the semiconductor device, and operates as a logic chip as will be described below.

A mode selecting terminal of the logic chip receives a mode selecting signal that selects a first or second test mode for testing the memory chip. Part of the logic chip terminals used in the normal operation of the semiconductor device are used as test terminals during the second test mode. That is, these terminals serve as first multipurpose terminals.

The logic chip has a pattern generator and a pattern selector. The pattern generator operates during the first test mode to generate internal test pattern(s) for the memory chip. The pattern selector selects, during the first test mode, the internal test pattern(s) outputted from the pattern generator. The result of a test executed according to the internal test pattern(s) is outputted from a test result terminal. The pattern selector selects, during the second test mode, an external test pattern supplied via a test terminal. The pattern selector outputs the selected test pattern to the memory chip. In this way, the memory chip mounted in the package is tested by use of, in accordance with the mode selecting signal, either the internal test pattern (the first test mode) generated within the logic chip or the external test pattern (the second test mode) supplied from the exterior.

The first test mode is used, for example, in a final test following a package assembly. The final test finds a defective memory chip (i.e., a defective SIP) generated by a damage occurred during a package process. Conventionally, a pattern generator that generates a test pattern for the memory chip mounted in the SIP was formed in the memory chip (built-in self test). For this reason, the conventional built-in self test was not able to test the interface between the logic chip and the memory chip. According to the present invention, a test function (hereinafter referred to as BIST function) similar to the built-in self test is formed outside the memory chip and within the logic chip mounted together with the memory chip in the package. For this reason, the BIST function can provide not only a detailed test of the memory chip but also a test of the interface between the logic and memory chips.

Since the pattern generator is formed in the logic chip, there is no need to supply a detailed test pattern for the memory chip from the exterior of the package. Accordingly, there is no need to directly connect the memory chip terminals to the external terminals of the package so as to supply the test pattern to the memory chip from the exterior. As a result, in the SIP or MCM mounted a memory chip and others on a system board, the number of the wires to be formed in the system board can be reduced, and hence the package cost can be reduced. When the reduction in number of the wires allows the system board to be formed in a smaller size, the package can be formed in a smaller size. Moreover, since the wires unnecessary for the normal operation (i.e., the operation of a shipped product) are not connected to the memory chip, any signal delay, characteristic degradation and the like due to the extra loads can be prevented.

The second test mode is used when it is desirable to evaluate the memory chip in a more detailed manner than in the first test mode. In the second test mode, for example, the semiconductor device is attached to an LSI tester, from which an external test pattern is applied to the semiconductor device. That is, such a detailed test pattern that cannot be supplied by the first test mode or a new test pattern is supplied as the external test pattern to the memory chip. For this reason, the second test mode is particularly effective in the development of a semiconductor device (an evaluation test following the assembly of a prototype) and in the analysis of a defective product.

Conventionally, in order to analyze the memory chip mounted in an SIP in detail, the memory chip terminals were directly connected to the external terminals of the package, as stated above. In the second test mode, the external test pattern supplied via the test terminal is supplied to the memory chip via the pattern selector. For this reason, the load of the test terminal (the external terminal) does not directly affect the memory chip terminals.

According to another aspect of the semiconductor device of the present invention, the pattern generator has a function to generate a plurality of the internal test patterns. The pattern generator outputs one of the internal test patterns to the memory chip in response to a pattern selecting signal supplied via the pattern selecting terminal of the logic chip. For this reason, the internal test patterns can be easily changed between the beginning period of the mass production and a stable period thereof. When memory chips whose capacities are different according to SIP specifications are mounted, the internal test patterns can be easily changed for respective memory chips. Also, when memory chips of different types are mounted according to SIP specifications, the internal test patterns can be easily changed for respective memory chips.

According to another aspect of the semiconductor device of the present invention, the pattern generator generates a first test pattern and a second test pattern which is constituted by adding a different test pattern to the first test pattern. That is, the first test pattern is included in the second test pattern. The test time period following a stabilization of the mass production can be shortened by performing the test, using the detailed second test pattern in the beginning period of the mass production when the fraction defective is high, and using the first test pattern, which is simple and exhibits a high detectivity of defectives, in the stable period of the mass production when the fraction defective is low.

According to another aspect of the semiconductor device of the present invention, two of the internal test patterns are a first test pattern not including a dummy write pattern for writing data into memory cells adjacent to a watched memory cell in the memory chip, and a second test pattern including the dummy write pattern. By using the dummy write pattern, the interference between the adjacent memory cells or the interference between the wires can be checked. In many cases, the interference between the memory cells is due to a variation in manufacturing condition of the memory chip (e.g., a variation in wire width). Thus, for example, it is possible to minimize the cost required for the final test by performing the test, using the second test pattern including the dummy write pattern when the manufacturing condition varies, and using the first test pattern when the manufacturing condition is stable.

According to another aspect of the semiconductor device of the present invention, the logic chip has a timing selecting terminal for receiving a timing selecting signal. The memory chip includes memory cells, and bit lines for inputting data to and outputting data from the memory cells. The pattern generator has a precharge control circuit for varying, in accordance with the timing selecting signal, a time period from the end of writing data into the memory cells until a start of precharging the bit lines. For this reason, the timing of the test pattern can be easily changed in accordance with the timing selecting signal supplied from the exterior even after assembly of the package.

According to another aspect of the semiconductor device of the present invention, the logic chip has a timing selecting terminal for receiving a timing selecting signal. The memory chip includes volatile memory cells each having a capacitor for holding data. The pattern generator has a refresh control circuit for varying, in accordance with the timing selecting signal, intervals at which refresh operations for the memory cells are executed (the refresh request intervals). The refresh characteristic of the memory cells (data holding characteristic) can be easily tested even after assembly of the package by changing the refresh request intervals in accordance with the timing selecting signal supplied from the exterior.

According to another aspect of the semiconductor device of the present invention, the logic chip has a fail mode terminal for receiving a fail mode signal, and a fail mode selector. The fail mode selector selects, during the first test mode, in accordance with the fail mode signal, a test interruption following a first fail or an execution of all tests in spite of fail(s). For example, in the final test following assembly of the packages, it is possible to quickly find non-defective products by interrupting the tests after the first fail. Besides, when analyzing defective memory chips, it is possible to easily estimate the causes of memory chip defects by setting the fail mode signal so as to execute all the tests in spite of any fails. Thereafter, the causes of the defects are determined by supplying the external test pattern via the test terminal.

The test time period following the stabilization of the mass production can be shortened by executing, in the beginning period of the mass production when the fraction defective is high, all the tests in spite of any fails, and by interrupting, in the stable period of the mass production when the fraction defective is low, the tests after the first fail.

According to another aspect of the semiconductor device of the present invention, a second multipurpose terminal serves as a test item terminal during the first test mode and serves as the normal terminal during the normal operation, the test item terminal outputs test items to be sequentially executed according to the internal test pattern(s). For this reason, during the first test mode, an LSI tester or the like that evaluates the SIP can readily recognize test items on which fails occur.

According to another aspect of the semiconductor device of the present invention, the logic chip has a pattern changing terminal for receiving a pattern changing signal, a pattern changing circuit, and a data comparator. The pattern changing circuit changes expected data in accordance with the pattern changing signal. The data comparator receives correct or incorrect expected data outputted from the pattern changing circuit in accordance with the pattern changing signal, compares the received data with data read from the memory chip, and outputs the comparison result as the test result.

The pattern changing circuit outputs incorrect expected data in accordance with the pattern changing signal. Therefore, even when the memory chip correctly operates, all the tests always fail. Accordingly, when a failure occurs in any circuit in the logic chip that operates during the first test mode and even when the comparison result always passes, the failure can be detected. That is, not only defects of the memory chip but also defects of the logic chip can be detected.

According to another aspect of the semiconductor device of the present invention, the semiconductor device is formed by mounting, in a single package, first and second memory chips and a logic chip having a logic circuit that controls these memory chips. In the semiconductor device, first and second memory chips are mounted in a single package, and a logic circuit that controls these first and second memory chips is included in the second memory chip. That is, the semiconductor device is formed as a System-In-Package (SIP) or a Multi-Chip-Package (MCP). For example, the first memory chip is a nonvolatile memory such as a flash memory, and the second memory chip is a volatile memory such as a DRAM, an SRAM or a pseudo SRAM.

The logic circuit has an external terminal, a test starting terminal, an access signal generator and a first selector. The external terminal receives an external signal supplied from the exterior of the semiconductor device so as to access the first and second memory chips. The test starting terminal receives a test starting signal activated when at least one of the first and second memory chips is/are tested and inactivated when the first and second memory chips are normally operated.

The access signal generator converts the external signal supplied for accessing the first memory chip to a memory access signal matching with the interface of the first memory chip. The first selector selects the external signal as a test signal during the activation of the test starting signal, selects the memory access signal during the inactivation of the test starting signal, and outputs the selected signal to the first memory chip. That is, during the test modes, the first selector selects the external signal, whereby the first memory chip can be directly accessed from the exterior. For this reason, the test program for testing the first memory chip alone can be diverted as the test program following an assembly of the SIP or semiconductor device. As a result, the test cost required for a program development or the like can be reduced.

Since the memory chip can be tested via the logic circuit after assembly of the semiconductor device, the mutual connection between the chips mounted in the semiconductor device can be tested.

According to another aspect of the semiconductor device of the present invention, the logic circuit has a first switching circuit. The first switching circuit outputs the external signal supplied from the external terminal, as the test signal, to the first selector during the activation of the test starting signal, and outputs the external signal to the access signal generator during the inactivation of the test starting signal. Thus, during the activation of the test starting signal, the external signal (test signal) is not supplied to the access signal generator. This can prevent malfunction of the access signal generator. Also, since the levels of input signals to the access signal generator do not vary, the inside of the access signal generator remains static. As a result, the power consumption during the test can be reduced.

According to another aspect of the semiconductor device of the present invention, the logic circuit has a memory selecting terminal, a buffer circuit, a second selector, and a second switching circuit. The memory selecting terminal receives a memory selecting signal for selecting the first and second memory chips to be tested. The buffer circuit receives the external signal supplied so as to access the second memory chip during the normal operation.

The second selector selects the test signal during the activation of the test starting signal, selects the external signal transmitted via the buffer circuit during the inactivation of the test starting signal, and outputs the selected signal to the second memory chip. The second switching circuit is disposed between the first switching circuit and the first selector. The second switching circuit transmits the test signal supplied via the first switching circuit to either the first or second selector in accordance with the memory selecting signal.

The memory selecting signal and the second switching circuit can determine whether the test signal should be outputted to the first memory chip or the second memory chip. For this reason, the first and second memory chips can be independently tested. Additionally, the second selector allows, during the test of the second memory chip, the test signal to be directly supplied to the second memory chip without being supplied through the buffer circuit. For this reason, the test signal is hardly delayed within the logic circuit. Moreover, any deviation in timings between the test signals can be prevented.

According to another aspect of the semiconductor device of the present invention, the logic circuit has a test mode terminal, a first test pattern generator, and a third selector. The test mode terminal receives a test mode signal to select one of test modes during the activation of the test starting signal. The first test pattern generator generates a first test pattern signal to test the first memory chip.

The third selector is disposed between the second switching circuit and the first selector. The third selector selects the external signal supplied via the second switching circuit when the test mode signal represents a first test mode, selects the first test pattern signal when the test mode signal represents a second test mode, and outputs the selected signal as the test signal to the first selector.

The first test pattern generator allows the first memory chip to be tested without receiving the test signals from the exterior. That is, the Built-in Self Test (BIST) for the memory chip included in the SIP or MCP can be executed.

According to another aspect of the semiconductor device of the present invention, the logic circuit has a second test pattern generator and a fourth selector. The second test pattern generator generates a second test pattern signal to test the second memory chip. The fourth selector is disposed between the second switching circuit and the second selector. The fourth selector selects the external signal supplied via the second switching circuit when the test mode signal represents the first test mode, selects the second test pattern signal when the test mode signal represents the second test mode, and outputs the selected signal as the test signal to the second selector.

The second test pattern generator allows the second memory chip to be tested without receiving the test signal from the exterior. That is, the Built-in Self Test (BIST) for the memory chip included in the SIP or MCP can be executed.

According to another aspect of the semiconductor device of the present invention, the logic circuit has a clock terminal and a clock converter. The clock terminal receives a clock signal supplied from the exterior of the semiconductor device. The clock converter converts the frequency of the clock signal received at the clock terminal and supplies the converted clock signal to the internal circuits of the logic circuit. This allows the logic circuit and the first and second memory chips to operate in optimum timings, without depending on the clock period of the system in which the semiconductor device is mounted.

According to another aspect of the semiconductor device of the present invention, the logic circuit has a clock generator that generates a clock signal to be used in the internal circuits of the logic circuit. Since the clock signal can be generated within the logic circuit, there is no need to receive the clock signal from the exterior, and hence a clock terminal is no longer required. This also allows the logic circuit and the first and second memory chips to operate in optimum timings, without depending on the clock period of the system in which the semiconductor device is mounted.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 24 is a diagram for explaining the correspondence between the external signals and the signals to be supplied to the memories;

DETAILED DESCRIPTION OF THE PREFERRED EMBODIMENTS

Embodiments of the present invention will be described below with reference to the drawings.

Figure 1:
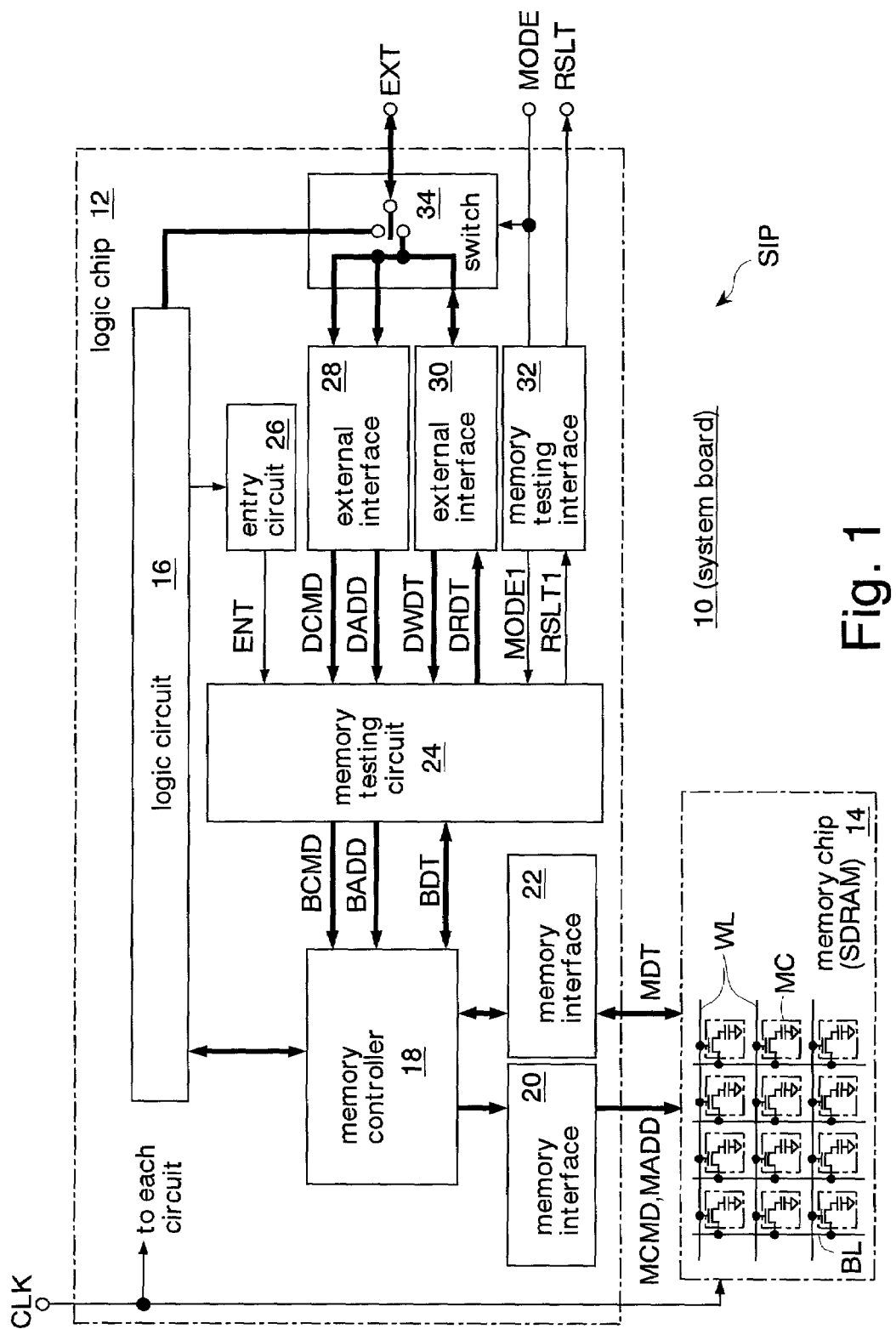
FIG. 1 is a block diagram showing the first embodiment of the present invention.

FIG. 1 shows the first embodiment of semiconductor device according to the present invention. This semiconductor device is formed, as a system-in-package (hereinafter simply referred to as SIP), by mounting a logic chip 12 and a memory chip 14 on a system board 10. In FIG. 1, small circles shown about the periphery of the logic chip 12 designate external terminals of the SIP. The logic chip 12 has memory connection terminals (not shown) for connection to terminals of the memory chip 14. In FIG. 1, signal lines designated by thick lines each consist of a plurality of signal lines.

The logic chip 12 has a logic circuit 16 that operates in synchronism with a clock signal CLK, a memory controller 18, memory interfaces 20 and 22, a memory testing circuit 24, an entry circuit 26, external interfaces 28 and 30, a memory testing interface 32, and a switch 34.

The memory chip 14 is, for example, an SDRAM (Synchronous DRAM), which operates in synchronism with the clock signal CLK, mounted on the system board. The memory chip 14 has a plurality of memory cells MC arranged in a matrix form, a plurality of bit lines BL for inputting data into these memory cells MC and outputting data therefrom, and word lines WL for selecting the memory cells MC. The memory cells MC each have a capacitor for holding data. That is, the memory cells MC are volatile memory cells.

The logic circuit 16 has a plurality of function blocks required as a system, and has a function to control the memory controller 18 to access the memory chip 14 during a normal operation. Here, the normal operation means an operation of the SIP as a product, in other word, an operation of the SIP as a system incorporated in portable equipment or the like.

The memory controller 18 changes the timings of command signals BCMD and address signals BADD from the memory testing circuit 24 such that they match with the memory chip 14. The memory controller 18 then outputs the timing-changed signals, as command signals MCMD and address signals MADD, to the memory chip 14 via the memory interface 20. The memory controller 18 also receives data signals BDT (write data) from the memory testing circuit 24 and then outputs them as data signals MDT to the memory chip 14 via the memory interface 22. The memory controller 18 also receives data signals MDT (read data) read from the memory chip 14 via the memory interface 22 and then outputs them as data signals BDT to the memory testing circuit 24.

Here, the signal lines between the memory controller 18 and the memory chip 14 are used both in the normal operation and in first and second test modes. Thus, in either the first or second test mode, a connection test (interface test) between the logic chip 12 and the memory chip 14 can be executed.

The memory testing circuit 24 operates in response to an entry signal ENT from the entry circuit 26. When an operation test of the memory chip 14 is commanded from the exterior of the SIP, the entry signal ENT is activated to be active until the termination of the test. The status of the memory testing circuit 24 is in either the first or second test mode in accordance with a mode signal MODE (MODE1) supplied from the exterior of the SIP via a mode terminal. Thus, the mode terminal and the mode signal MODE serve as a mode selection terminal for selecting a test mode and a mode selection signal, respectively.

In the first test mode, the memory testing circuit 24 generates an internal test pattern for testing the memory chip 14. That is, the memory testing circuit 24 has a built-in self-test function (BIST test) for the memory chip 14 mounted in the SIP. A result of the BIST test is outputted as a test result signal RSLT1 at the end of the BIST test.

In the second test mode, the memory testing circuit 24 masks the BIST function and functions to receive command signals DCMD, address signals DADD, and data signals DWDT (write data) supplied from the exterior of the SIP and output these received signals to the memory controller 18. That is, in the second test mode, the memory testing circuit 24 serves as a transmission path for directly transmitting to the memory chip 14 an external test pattern supplied from the exterior.

Receiving a test request of the memory chip 14 from the logic circuit 16, the entry circuit 26 activates the entry signal ENT. The external interfaces 28 and 30 operate during the second test mode. The external interface 28 receives the command signals DCMD and address signals DADD supplied from the exterior of the SIP and outputs these received signals to the memory testing circuit 24. The external interface 30 receives the write data signals DWDT supplied from the exterior of the SIP and outputs them to the memory testing circuit 24. The external interface 30 also receives read data signals DRDT from the memory testing circuit 24 and outputs them to external terminals EXT.

The memory testing interface 32 receives the mode signal MODE and outputs the received signal as the mode signal MODE1. The memory testing interface 32 also receives the test result signal RSLT1 and outputs the received signal as a test result signal RSLT to a test result terminal.

The switch 34 connects the external terminals EXT to the logic circuit 16 during the normal operation, and connects part of the external terminals EXT to the external interfaces 28 and 30 during the second test mode. That is, the part of external terminals EXT are first multipurpose terminals that are used as normal terminals during the normal operation and used as test terminals during the second test mode.

Figure 2:
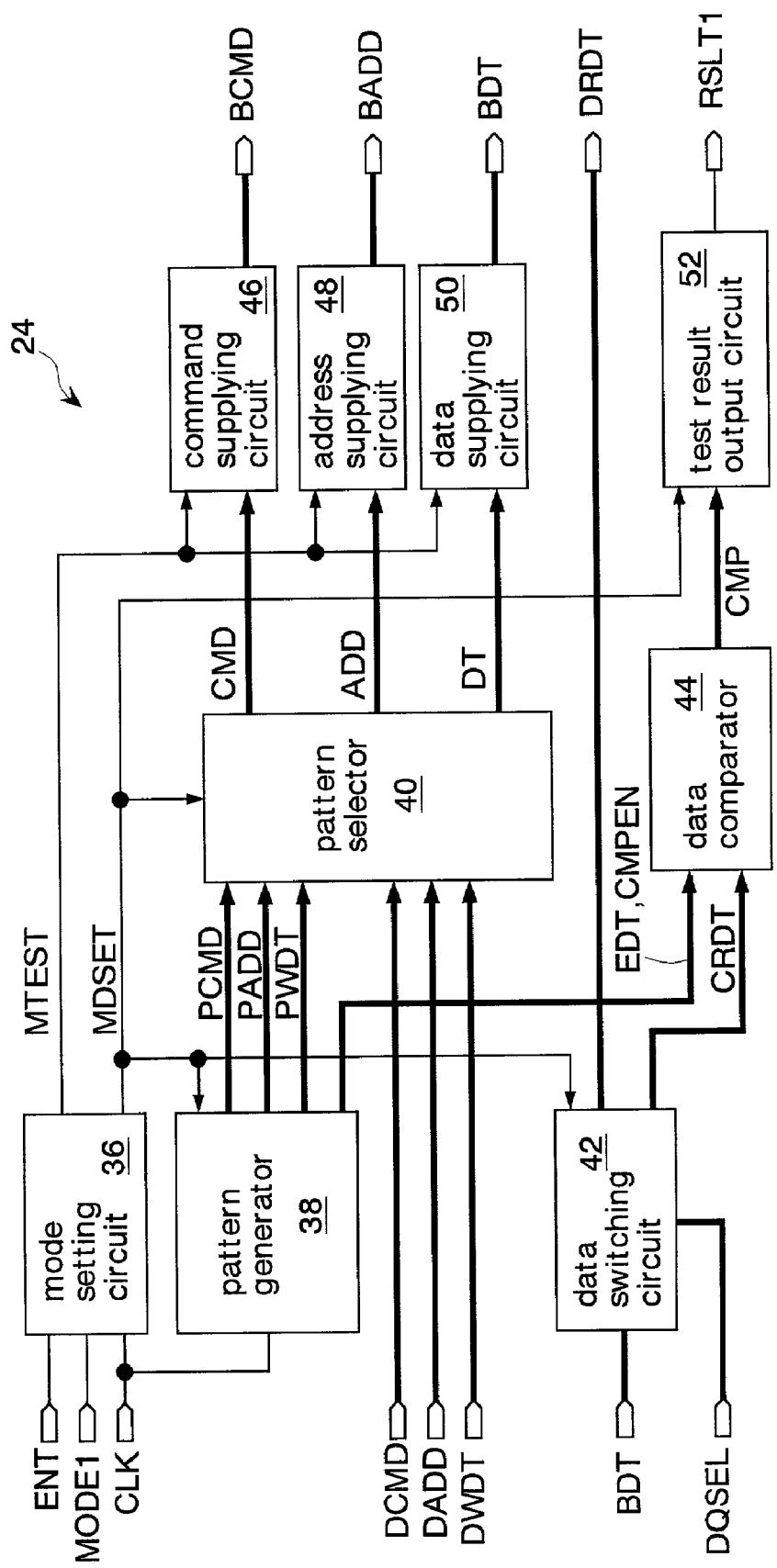
FIG. 2 is a block diagram showing the details of the memory testing circuit shown in FIG. 1.

FIG. 2 shows the details of the memory testing circuit 24 shown in FIG. 1. The memory testing circuit 24 has a mode setting circuit 36, a pattern generator 38, a pattern selector 40, a data switching circuit 42, a data comparator 44, a command supplying circuit 46, an address supplying circuit 48, a data supplying circuit 50 and a test result output circuit 52.

The mode setting circuit 36 receives the entry signal ENT in synchronism with the clock signal CLK and outputs the received signal as a memory testing signal MTEST. The memory testing signal MTEST is activated during the first and second test modes. When activating the memory testing signal MTEST, the mode setting circuit 36 also outputs the mode signal MODE1 as a mode setting signal MDSET. The mode signal MODE1 and mode setting signal MDSET each exhibit a high level during the first test mode and exhibit a low level during the second test mode.

The pattern generator 38 is activated, in response to the high level of the mode setting signal MDSET (the first test mode), to generate an internal test pattern. The generated internal test pattern is outputted as command signals PCMD, address signals PADD and data signals PWDT (write data). For example, the internal test patterns include test patterns for executing a plurality of tests, such as write and read patterns for an ALL-0 test, write and read patterns for an ALL-1 test, and patterns for a marching test. The pattern generator 38 also outputs both an expected data EDT, which is a write data to the memory chip 14, and a comparison enable signal CMPEN to the data comparator 44. When the comparison result in the data comparator 44 shows a difference, that is, the occurrence of an error, the pattern generator 38 stops the operation.

When the mode setting signal MDSET is at the high level (the first test mode), the pattern selector 40 selects the command signals PCMD, address signals PADD and data signals PDT outputted from the pattern generator 38. When the mode setting signal MDSET is at the low level (the second test mode), the pattern selector 40 selects the command signals DCMD, address signals DADD and write data signals DWDT supplied from the exterior. The pattern selector 40 outputs the thus selected signals as command signals CMD, address signals ADD and data signals DT.

When the mode setting signal MDSET is at the high level, the data switching circuit 42 receives the data signals BDT (the read data) read from the memory chip 14 and outputs the received data signals, as read data signals CRDT, to the data comparator 44. When the mode setting signal MDSET is at the low level, the data switching circuit 42 outputs the received data signals, as the read data signals DRDT, to the exterior. In this example, the bit width of the read data signals DRDT (e.g., 8 bits) is smaller than that of the data signals BDT (e.g., 32 bits). That is, the data switching circuit 42 divides the data signals BDT received at one time into a plurality of signals and outputs them as read data signals DRDT at a plurality of times in accordance with data selecting signals DQSEL. Particularly, the smaller bid width of the read data signals DRDT to be outputted to the exterior during the second test mode can reduce the number of the test terminals. This can reduce the number of the multipurpose terminals each burdened with an extra load, and can minimize the affection caused by the test terminals during the normal operation.

The data comparator 44 compares, in synchronism with the comparison enable signal CMPEN, the read data signals CRDT with the expected data EDT and outputs the comparison result as a comparison result signal CMP during the first test mode. When the comparison result shows equivalence, the comparison result signal CMP exhibits a low level. When the comparison result shows a difference, the comparison result signal CMPP exhibits a high level.

When the memory testing signal MTEST is activated, the command supplying circuit 46, address supplying circuit 48 and data supplying circuit 50 receive the command signals CMD, address signals ADD and data signals DT, respectively, from the pattern selector 40, and outputs these received signals as the command signals BCMD, address signals BADD and data signals BDT, respectively, to the memory controller 18 shown in FIG. 1.

The test result output circuit 52 holds the comparison result signal CMP supplied from the data comparator 44, and outputs the held signal as the test result signal RSLT1 at the end of the test. Although not shown in the drawings, the test result output circuit 52 causes the pattern generator 38 to stop its generation of the test pattern, and causes the test result signal RSLT1 to exhibit the high level once the comparison result shows a difference (once the comparison result signal CMP exhibits the high level). A classification tester for testing the SIP decides, when receiving the test result signal RSLT (FIG. 1) exhibiting the high level, that the SIP is a defective product. To make a classification, this classification tester only need to activate the first test mode and receive the test result, and therefore may be a simple evaluation board having no function to generate any test patterns. Since the number of the SIP external terminals to be used in the first test mode is small, it is possible to execute the tests with many SIPs mounted on the evaluation board. As a result, the test time can be shortened.

Figure 3:
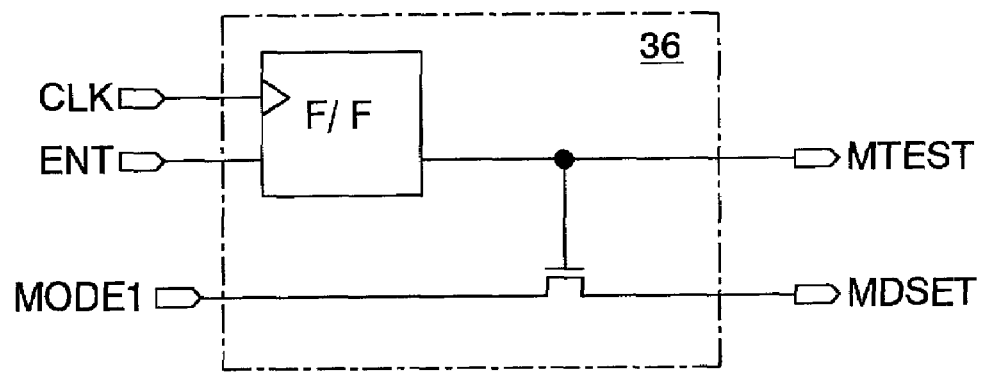
FIG. 3 is a circuit diagram showing the details of the mode setting circuit shown in FIG. 2.

FIG. 3 shows the details of the mode setting circuit 36 shown in FIG. 2. The mode setting circuit 36 has a flip-flop F/F that takes in the entry signal ENT in synchronism with the clock signal CLK and that outputs the taken-in signal as the memory testing signal MTEST, and an nMOS transistor that receives at its gate the memory testing signal MTEST.

Figure 4:
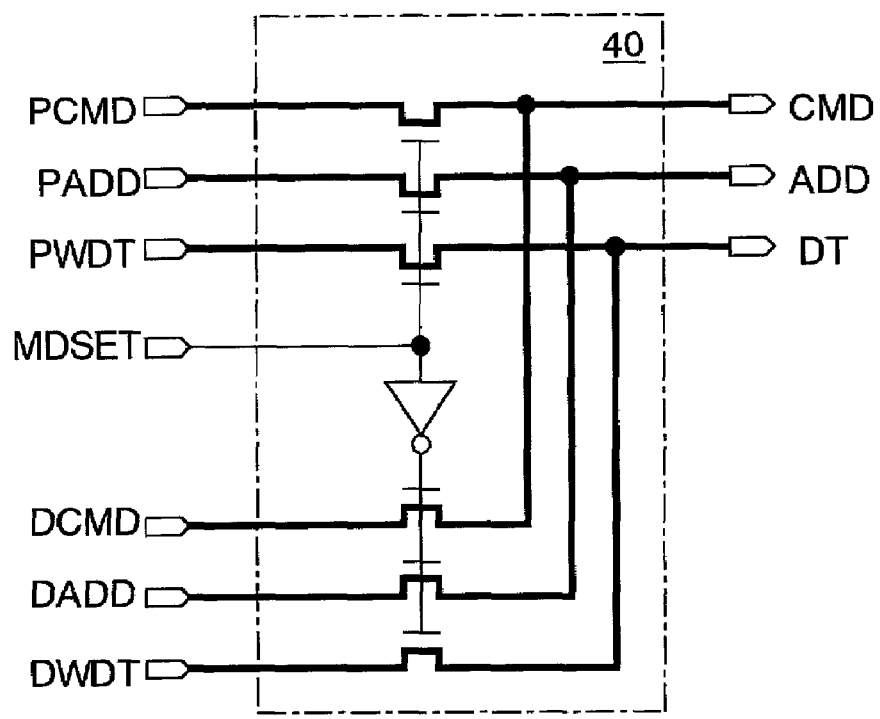
FIG. 4 is a circuit diagram showing the details of the pattern selector shown in FIG. 2.

FIG. 4 shows the details of the pattern selector 40 shown in FIG. 2. The pattern selector 40 has nMOS transistors that are turned on in response to the mode setting signal MDSET exhibiting the high level, and nMOS transistors that are turned on in response to the mode setting signal MDSET exhibiting the low level. That is, during the first test mode, the command signals PCMD, address signals PADD and write data signals PWDT from the pattern generator 38 are transmitted as the command signals CMD, address signals ADD and data signals DT to the supplying circuits 46, 48 and 50; and during the second test mode, the command signals DCMD, address signals DADD, and write data signals DWDT from the exterior are transmitted as the command signals CMD, address signals ADD and data signals DT to the supplying circuits 46, 48 and 50.

Figure 5:
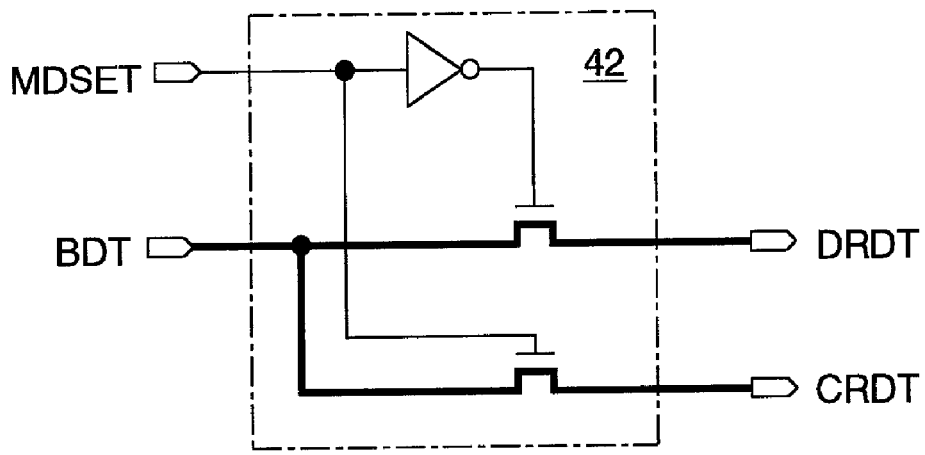
FIG. 5 is a circuit diagram showing the details of the data switching circuit shown in FIG. 2.

FIG. 5 shows the details of the data switching circuit 42 shown in FIG. 2. The data switching circuit 42 has nMOS transistors that are turned on in response to the mode setting signal MDSET exhibiting the high level, and nMOS transistors that are turned on in response to the mode setting signal MDSET exhibiting the low level. That is, the data signals BDT from the memory chip 14 are transmitted as the read data signals CRDT to the data comparator 44 during the first test mode, while they are transmitted as the read data signals DRDT to the exterior during the second test mode.

Figure 6:
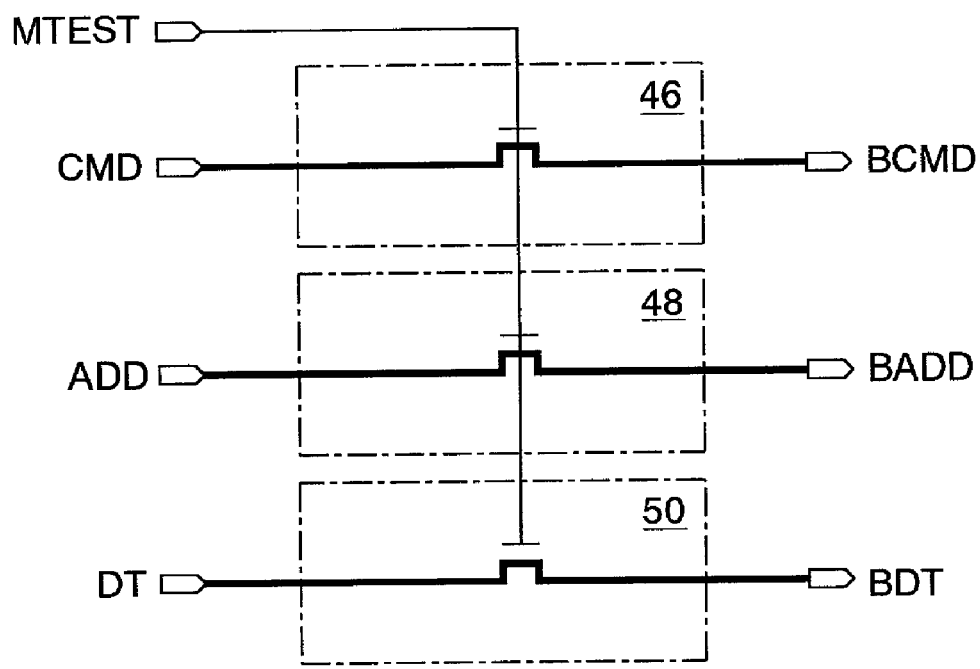
FIG. 6 is a circuit diagram showing the details of the command, address, and data supplying circuits shown in FIG. 2.

FIG. 6 shows the details of the command supplying circuit 46, address supplying circuit 48 and data supplying circuit 50 shown in FIG. 2. These supplying circuits 46, 48 and 50 each have an nMOS transistor that is turned on in response to the mode setting signal MDSET exhibiting the high level. That is, during the first and second test modes, the command signals CMD, address signals ADD and write data signals DT are transmitted as the command signals BCMD, address signals BADD and the data signals BDT to the memory chip 14.

In the semiconductor device described above, for example, in a final test using an evaluation board after a package assembly, the mode signal MODE is caused to exhibit the high level, and the SIP shifts into the first test mode. The pattern generator 40 in the logic chip 12 generates an internal test pattern, executing the test of the memory chip 14. Then, the memory chip 14 and the interfaces between the logic chip 12 and the memory chip 14 are tested.

If a defective SIP whose defect is assumed to be due to the memory chip 14 is evaluated, an LSI tester to which the SIP is attached causes the mode signal MODE to exhibit the low level, and the SIP shifts into the second test mode. The LSI tester supplies a detailed test pattern that cannot be supplied in the first test mode or a new test pattern to the memory chip 14. Then, a detailed evaluation of the memory chip 14 is carried out to determine the cause of the defect of the memory chip 14. The second test mode is particularly effective in the development of a semiconductor device (an evaluation test following the assembly of a prototype) and in the analysis of a defective product. An External test pattern supplied during the second test mode is supplied to the memory chip 14 via the pattern selector 40. For this reason, the terminals of the memory chip 14 will not be directly affected by the loads of the external terminals EXT.

In the present embodiment described above, the pattern generator 38 for generating an internal test pattern to test the memory chip 14 was formed in the logic chip 12. This realizes that the memory chip 14 mounted in the package can be tested with a minimum number of external terminals required for the test and that the connections between the logic chip 12 and the memory chip 14 can be tested at the same time.

The pattern selector 40 selected, in accordance with the mode signal MODE supplied from the exterior, the internal test pattern generated by the pattern generator 38 or the external test pattern supplied from the exterior. For this reason, the memory chip 14 can be tested in detail without directly connecting the terminals of the memory chip 14 to the external terminals EXT. Consequently, the terminals of the memory chip 14 are not directly affected by the loads of the external terminals EXT during the evaluation performed according to the external test pattern, either.

As stated above, the terminals of the memory chips 14 are not directly connected to the external terminals EXT. For this reason, in a case when the memory chip 14 is mounted on the SIP system board 10, the number of the wires formed in the system board 10 can be reduced, which can reduce the package cost. In a case when the reduction of the wires in number can reduce the area of the system board 10, the package size can be reduced, which can reduce the ultimate product cost. Since none of the wires unnecessary for the normal operation are connected to the memory chip, any signal delay, characteristic degradation and the like that otherwise would occur due to extra loads can be prevented.

Figure 7:
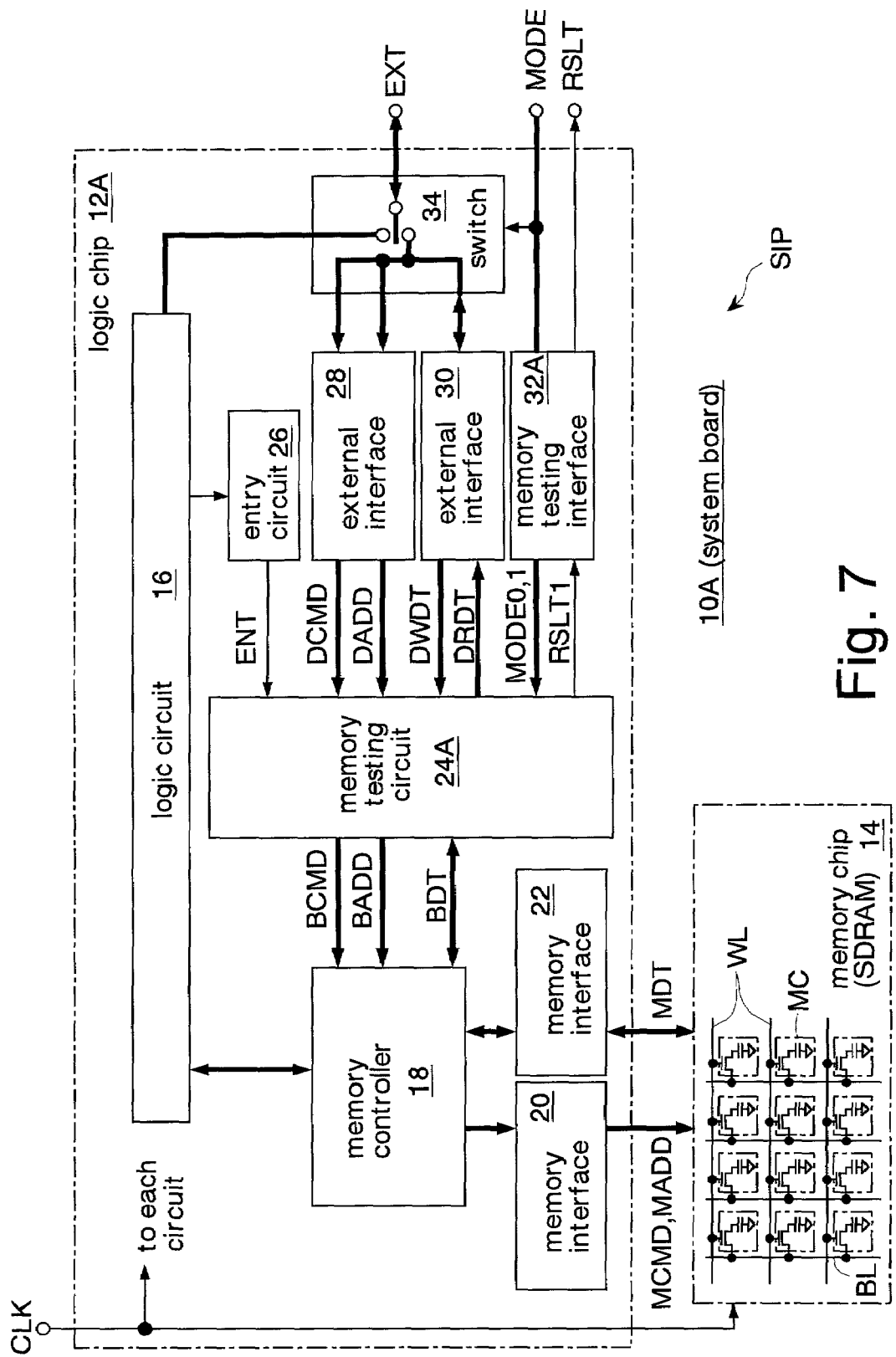
FIG. 7 is a block diagram showing the second embodiment of the present invention.

FIG. 7 shows the second embodiment of semiconductor device according to the present invention. In this embodiment, circuits and signals corresponding to those described in the foregoing first embodiment are identified by the same reference designations, and their detailed descriptions are omitted.

In this second embodiment, an SIP is formed by mounting a logic chip 12A and the memory chip 14 on a system board 10A. In the logic chip 12A, a memory testing circuit 24A and a memory testing interface 32A are formed in place of the memory testing circuit 24 and memory testing interface 32 of the first embodiment. The memory testing circuit 24A and memory testing interface 32A receive 2-bit mode signals MODE0, 1 (MODE). The other structures of the second embodiment are identical to those of the first embodiment.

The memory testing circuit 24A gets into the first or second test mode in response to the mode signals MODE0, 1 supplied from the exterior of the SIP. Specifically, when the levels of the mode signals MODE0, 1 are "H, H" or "L, L", the memory testing circuit 24A gets into the first test mode; and when the levels of the mode signals MODE0, 1 are "H, L", the memory testing circuit 24A gets into the second test mode.

Figure 8:
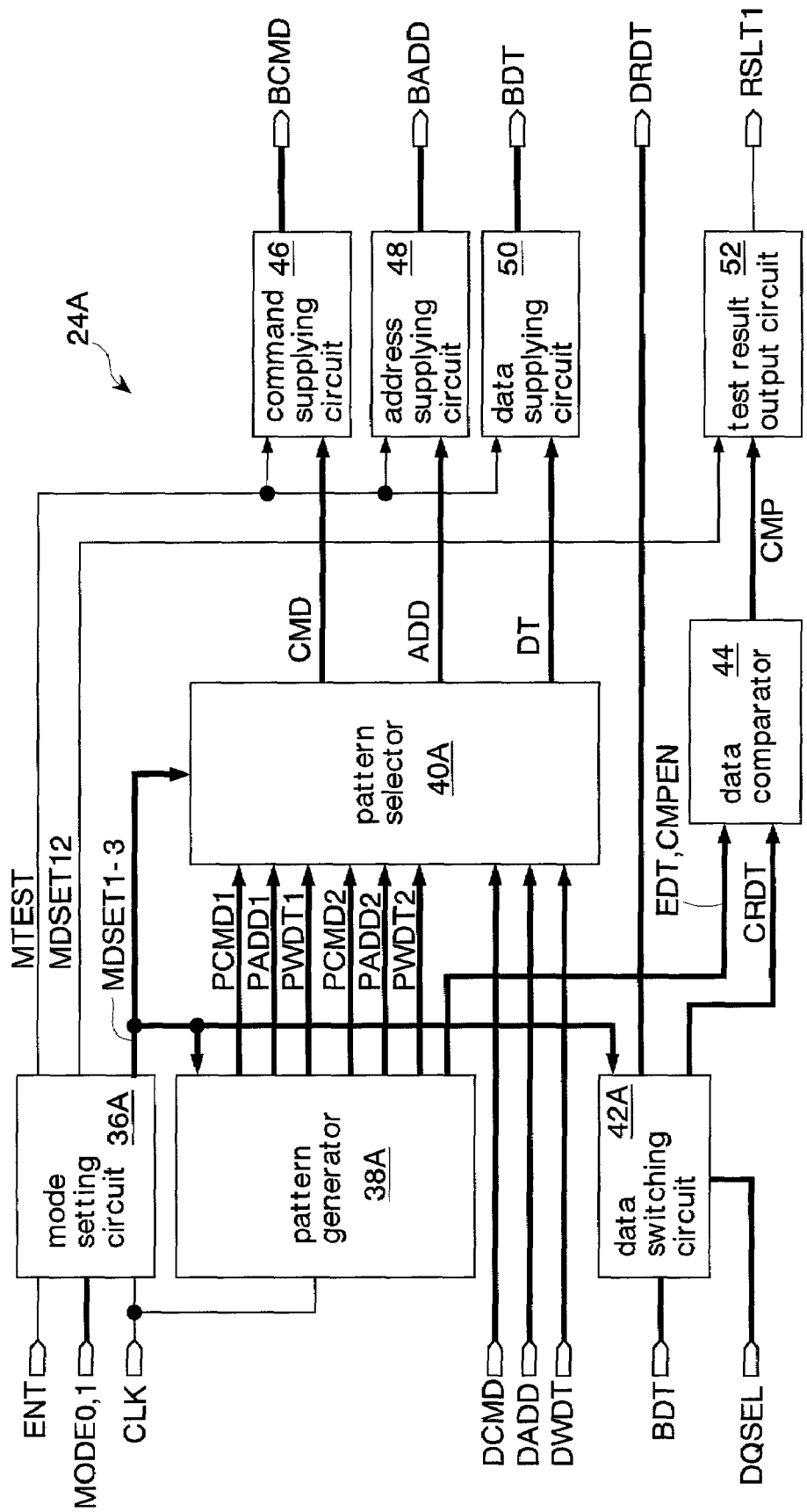
FIG. 8 is a block diagram showing the details of the memory testing circuit shown in FIG. 7.

FIG. 8 shows the details of the memory testing circuit 24A shown in FIG. 7. The memory testing circuit 24A has a mode setting circuit 36A that receives the mode signals MODE0, 1, a pattern generator 38A that receives a mode setting signal MDSET1, MDSET2 or MDSET3, a pattern selector 40A, and a data switching circuit 42A, which are different from the mode setting circuit 36, the pattern generator 38, the pattern selector 40 and the data switching circuit 42, respectively, of the first embodiment. The other structures are identical to those of the first embodiment.

The mode setting circuit 36A activates, when the 2-bit mode signals MODE0, 1 exhibit the levels of "H, H", "L, L" or "H, L", the mode setting signal MDSET1, MDSET2, or MDSET3, respectively. The activation of a mode setting signal MDSET12, which is the OR logic of the mode setting signal MDSET1 or MDSET2, means the first test mode.

The pattern generator 38A outputs, as an internal test pattern (a first test pattern), command signals PCMD1, address signals PADD1 and data signals PWDT1 at the activation of the mode setting signal MDSET1. The pattern generator 38A outputs, as an internal test pattern (a second test pattern), command signals PCMD2, address signals PADD2 and data signals PWDT2 at the activation of the mode setting signal MDSET2. Thus, as will be described later, the mode signals MODE0, 1 (mode signals MODE) serve as pattern selecting signals that select an internal test pattern, while mode terminals that receive the mode signals MODE serve as pattern selecting terminals.

The pattern selector 40A selects the first test pattern at the activation of the mode setting signal MDSET1, selects the second test pattern at the activation of the mode setting signal MDSET2, and selects the external test pattern (the command signals DCMD, address signals DADD and write data signals DWDT) at the activation of the mode setting signal MDSET3, and outputs the selected signals as the command signal CMD, address signals ADD and data signals DT. That is, in this embodiment, one of the three test patterns is supplied to the memory chip 14.

The data switching circuit 42A receives the data signals BDT read from the memory chip 14 and outputs them as the read data signals CRDT at the activation of the mode setting signal MDSET1 or MDSET2, while it outputs the data signals BDT as the read data signal DRDT at the activation of the mode setting signal MDSET3. That is, the data switching circuit 42A transmits, as in the first embodiment, the data signals BDT read from the memory chip 14 to the data comparator 44 during the first test mode and to the external interface 30 of FIG. 7 during the second test mode.

Figure 9:
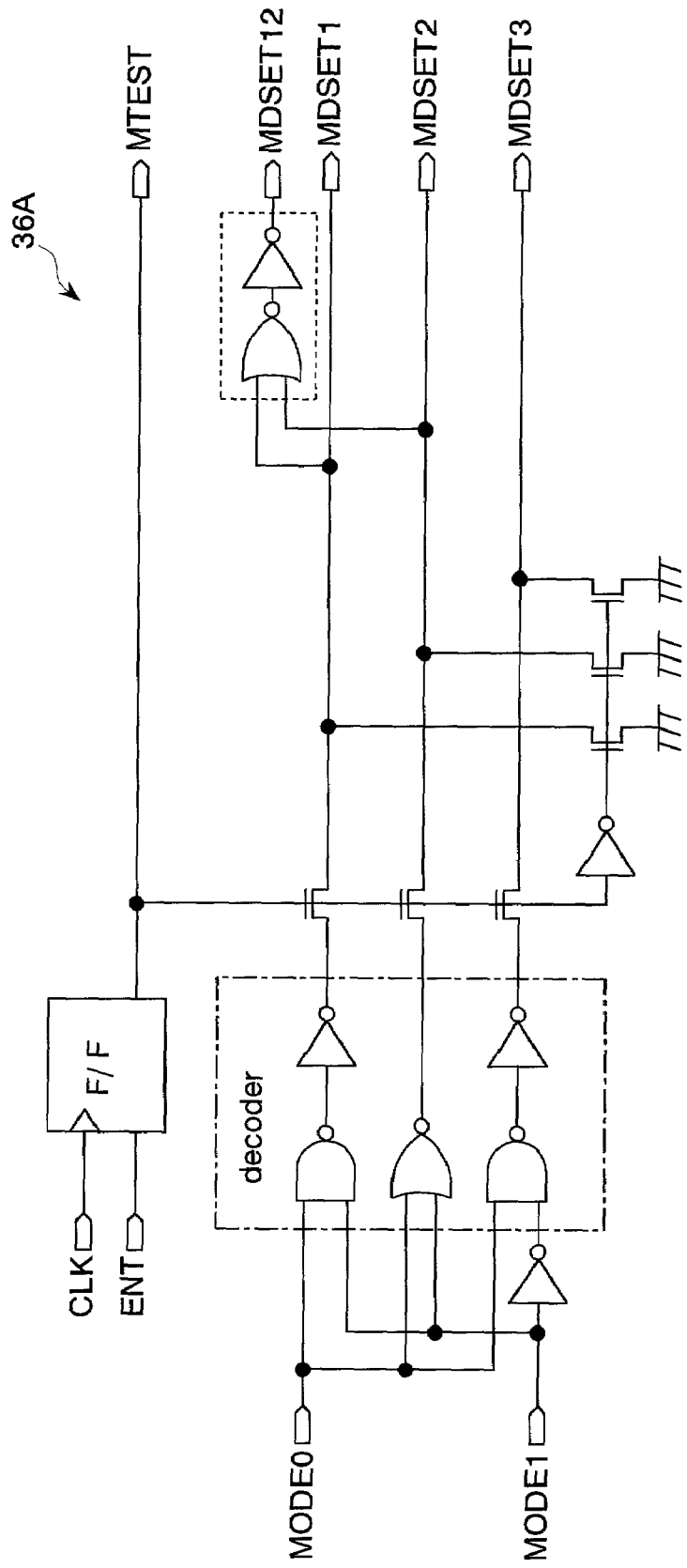
FIG. 9 is a circuit diagram showing the details of the mode setting circuit shown in FIG. 8.

FIG. 9 shows the details of the mode setting circuit 36A shown in FIG. 8. The mode setting circuit 36A has a flip-flop F/F identical to that of the first embodiment, a decoder that produces the mode setting signals MDSET1, MDSET2, and MDSET3 from the mode signals MODE0, 1 (i.e., MODE0 and MODE1), three nMOS transistors that receive at their respective gates the memory testing signal MTEST, three nMOS transistors that reset the respective mode setting signals MDSET1, MDSET2, and MDSET3 to the low level when the memory testing signal MTEST exhibits the low level, and an OR circuit that produces the mode setting signal MDSET12 from the mode setting signals MDSET1 and MDSET2.

Figure 10:
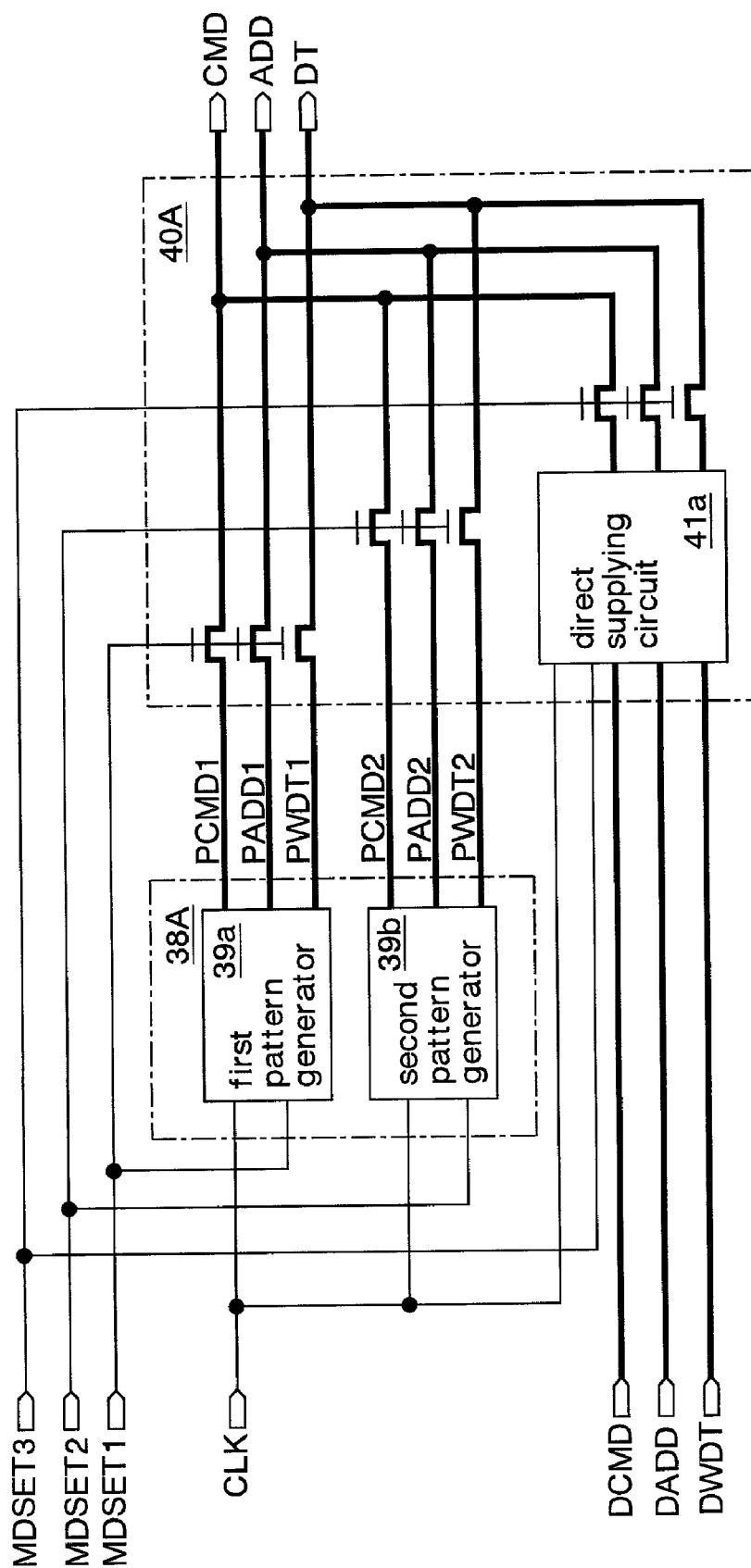
FIG. 10 is a block diagram showing the details of the pattern generator and pattern selector shown in FIG. 8.

FIG. 10 shows the details of the pattern generator 38A and pattern selector 40A shown in FIG. 8.

The pattern generator 38A has first and second pattern generators 39a and 39b. The first pattern generator 39a is activated in response to the high level of the mode setting signal MDSET1 (the first test mode) to generate the first test pattern (internal test pattern) in synchronism with the clock signal CLK. The generated internal test pattern is outputted as the command signals PCMD1, address signals PADD1 and data signal PWDT1 (write data). The second pattern generator 39b is activated in response to the high level of the mode setting signal MDSET2 (the first test mode) to generate the second test pattern (internal test pattern) in synchronism with the clock signal CLK. This generated internal test pattern is outputted as the command signals PCMD2, address signals PADD2 and data signals PWDT2 (write data).

Here, the second test pattern is produced by adding a different test pattern to the first test pattern. In other words, the first test pattern is included in the second test pattern.

The pattern selector 40A has a direct supplying circuit 41a and a plurality of nMOS transistors for selecting, in response to the mode setting signal MDSET1, MDSET2 or MDSET3, the internal test pattern from the first pattern generator 39a, the internal test pattern from the second pattern generator 39b, or the external test pattern, respectively. The pattern selector 40A outputs the selected test pattern as the command signals CMD, address signals ADD and data signals DT. The direct supplying circuit 41a is activated in response to the high level of the mode setting signal MDSET3 (the second test mode) to take in the command signals DCMD, address signals DADD and write data signals DWDT in synchronism with the clock signal CLK.

Figure 11:
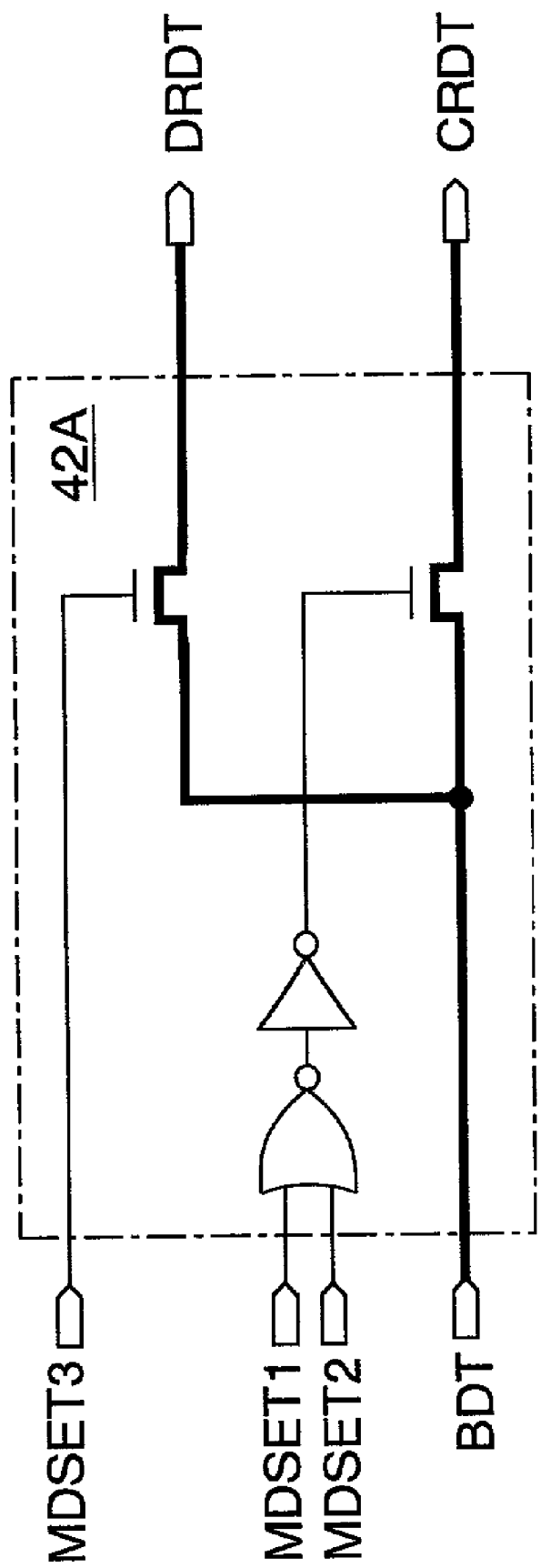
FIG. 11 is a circuit diagram showing the details of the data switching circuit shown in FIG. 8.

FIG. 11 shows the details of the data switching circuit 42A shown in FIG. 8. The data switching circuit 42A has an nMOS transistor that is turned on at the activation of the mode setting signal MDSET3 to transmit the data signals BDT as the read data signals DRDT, and an nMOS transistor that is turned on at the activation of the mode setting signal MDSET1 or MDSET2 to transmit the data signals BDT as the read data signals CRDT.

In the semiconductor device of the second embodiment described above, as in that of the first embodiment, the first test mode is used to execute a final test following the assembly of the semiconductor device, and the second test mode is used to perform a detailed evaluation of the memory chip 14. Moreover, in the present second embodiment, in the final test, the detailed second test pattern is used to perform the test in the beginning period of the mass production when the fraction defective is high, while the simple first test pattern (a test pattern where the detectivity of the defective is high) is used to perform the test in a stable period of the mass production when the fraction defective is low. This test pattern simplification in a particular period of the mass production can shorten the test time.

The present embodiment can provide similar effects to those of the foregoing first embodiment. Besides, in the present embodiment, the first or second test pattern is selectively outputted to the memory chip 14 in accordance with the mode signals MODE. This easy change of the internal test patterns, for example, between the beginning and stable periods of the mass production can shorten the test time.

Figure 12:
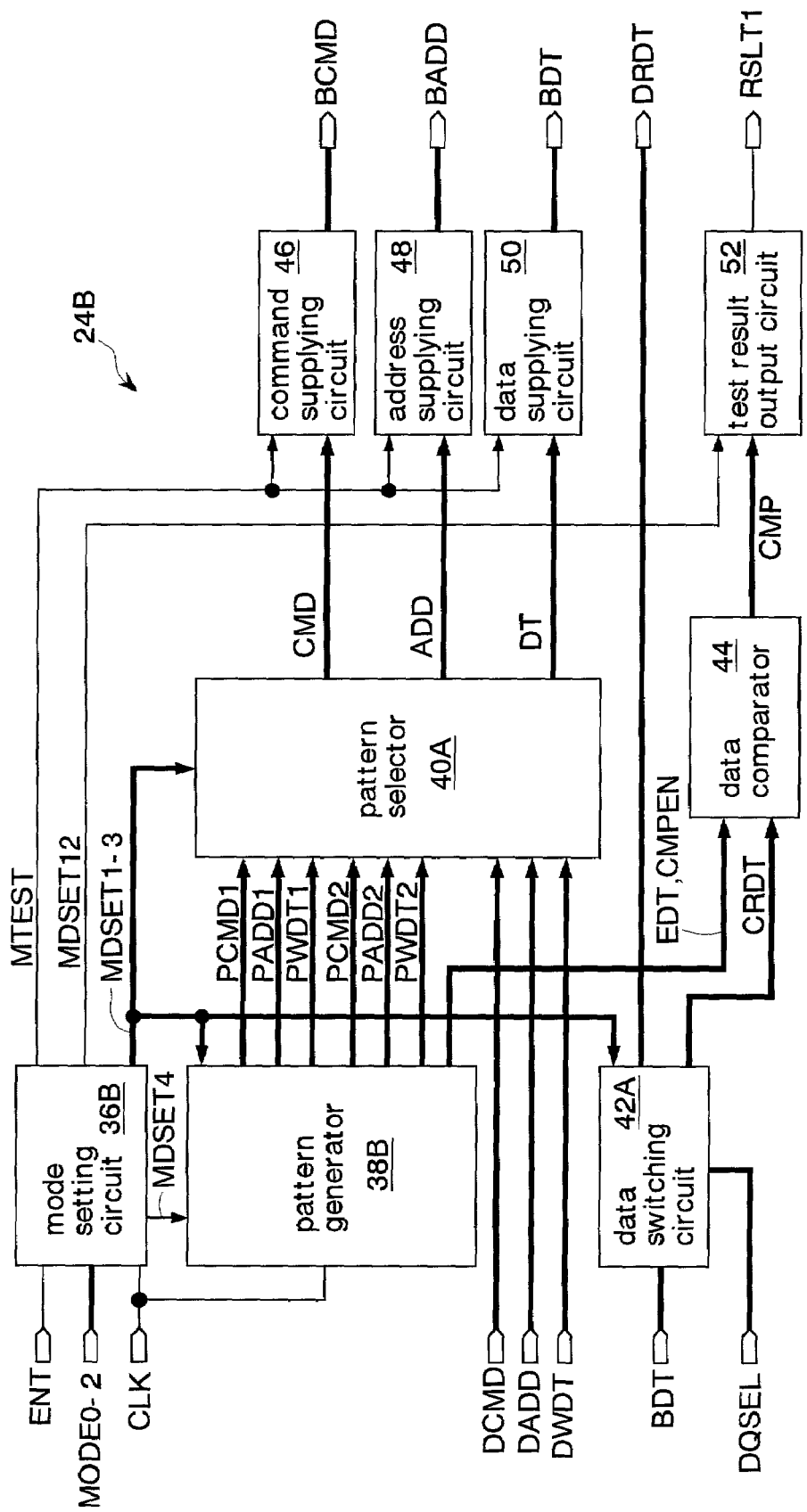
FIG. 12 is a block diagram showing the third embodiment of the present invention.

FIG. 12 shows a memory testing circuit 24B in the third embodiment of semiconductor device according to the present invention. In this embodiment, circuits and signals corresponding to those described in the foregoing first and second embodiments are identified by the same reference designations, and their detailed descriptions are omitted.

In this third embodiment, the memory testing circuit 24B and a memory testing interface (not shown) are formed in place of the memory testing circuit 24 and memory testing interface 32 of the first embodiment. The structures of the third embodiment other than the memory testing circuit 24B and memory testing interface (not shown) are identical to those of the first and second embodiments.

The memory testing circuit 24B has a mode setting circuit 36B that receives mode signals MODE0–2 and a pattern generator 38B that receives mode setting signals MDSET1–4, which are different from the mode setting circuit 36A and pattern generator 38A of the second embodiment. The other structures are identical to those of the first and second embodiments. Here, the mode signal MODE2 corresponds to a timing selecting signal, and a mode terminal that receives the mode signal MODE2 (MODE) supplied from the exterior corresponds to a timing selecting terminal.

The mode setting circuit 36B activates, when the mode signals MODE0, 1 exhibit the level of "H, H", "L, L" or "H, L", the mode setting signal MDSET1, MDSET2 or MDSET3, respectively. Also, the mode setting circuit 36B outputs the mode signal MODE2 as the mode setting signal MDSET4. The activation of the mode setting signal MDSET12, which is the OR logic of the mode setting signal MDSET1 or MDSET2, means the first test mode as in the second embodiment.

The pattern generator 38B outputs, as an internal test pattern (the first test pattern), the command signals PCMD1, address signals PADD1 and data signals PWDT1 at the activation of the mode setting signal MDSET1. The pattern generator 38B outputs, as an internal test pattern (the second test pattern), the command signal PCMD2, address signal PADD2 and data signal PWDT2 at the activation of the mode setting signal MDSET2. Additionally, the pattern generator 38B changes, in accordance with the level of the mode setting signal MDSET4, the timing of the test pattern to be outputted. Specifically, the reference clock signals that provide signal edges are switched in accordance with the mode setting signal MDSET4, thereby producing the command signals PCMD1 and the others in a different timing.

Figure 13:
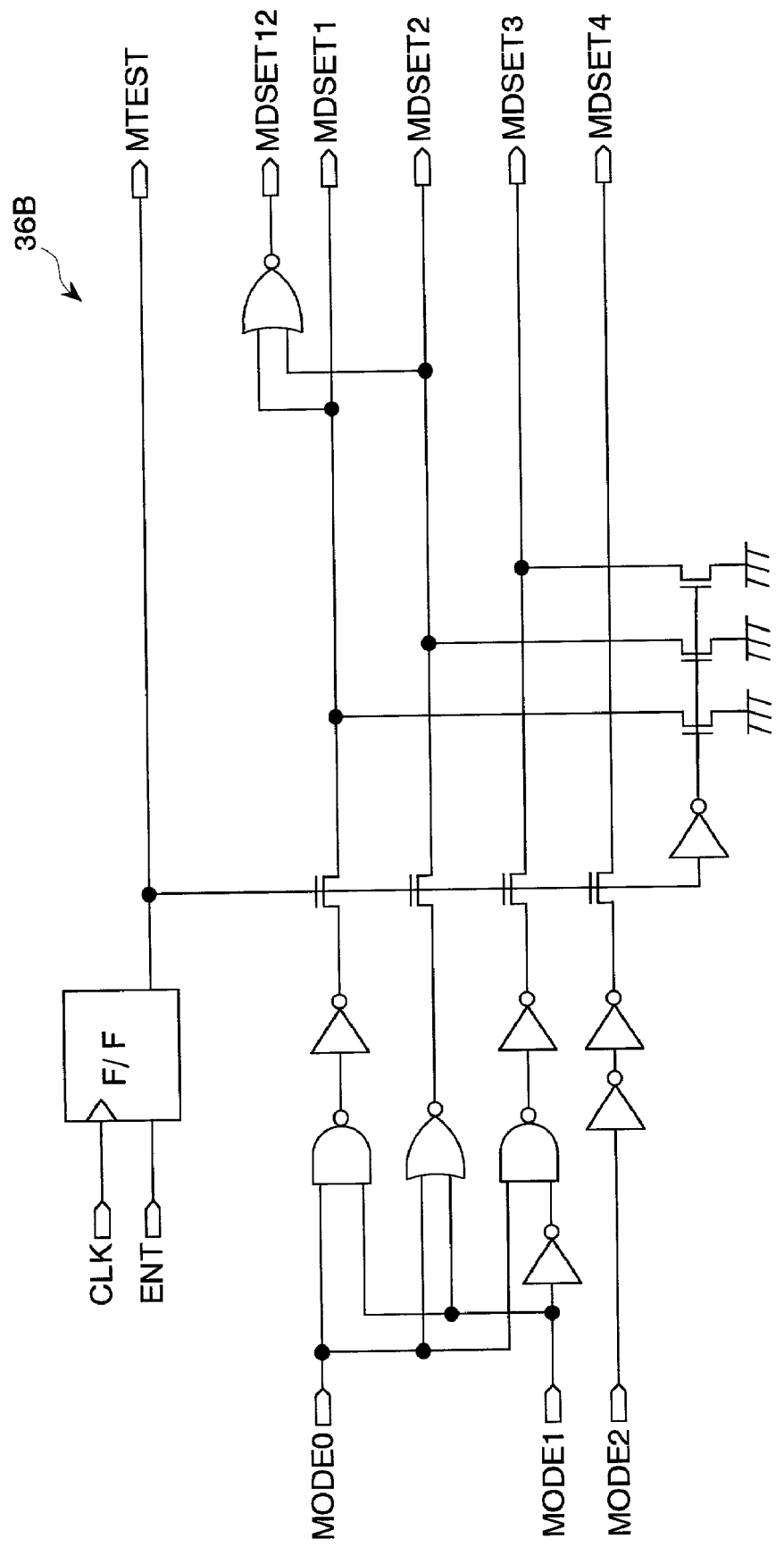
FIG. 13 is a circuit diagram showing the details of the mode setting circuit shown in FIG. 12.

FIG. 13 shows the details of the mode setting circuit 36B shown in FIG. 12. The mode setting circuit 36B is constituted by adding to the mode setting circuit 36A of the second embodiment (FIG. 9) a buffer (two inverters) and an nMOS transistor for receiving the mode signal MODE2 and outputting the received signal as the mode setting signal MDSET4. The nMOS transistor outputs the mode setting signal MDSET4 when the memory testing signal MTEST is at the high level.

Figure 14:
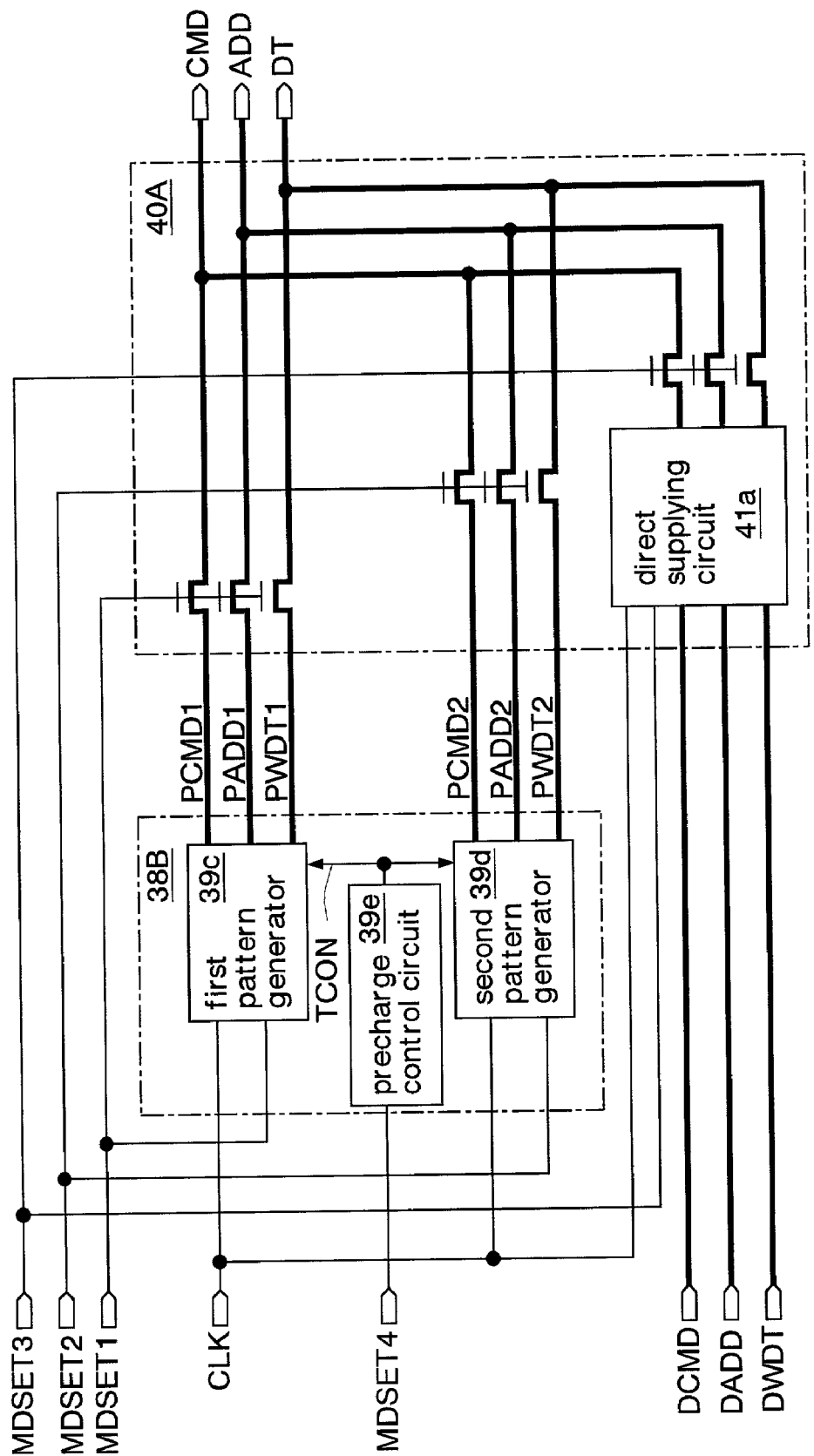
FIG. 14 is a block diagram showing the details of the pattern generator and pattern selector shown in FIG. 12.

FIG. 14 shows the details of the pattern generator 38B and pattern selector 40A shown in FIG. 12. The pattern generator 38B has first and second pattern generators 39c and 39d and a precharge control circuit 39e. The first pattern generator 39c is activated in response to the high level of the mode setting signal MDSET1 (the first test mode) to generate the first test pattern (internal test pattern) in synchronism with the clock signal CLK. The generated internal test pattern is outputted as the command signals PCMD1, address signals PADD1 and data signals PWDT1 (write data). The second pattern generator 39d is activated in response to the high level of the mode setting signal MDSET2 (the first test mode) to generate the second test pattern (internal test pattern) in synchronism with the clock signal CLK. The generated internal test pattern is outputted as the command signals PCMD2, address signals PADD2 and data signals PWDT2 (write data).

The precharge control circuit 39e outputs, in response to the mode setting signal MDSET4, a timing control signal TCON to the first and second pattern generators 39c and 39d. In response to a high level of the timing control signal TCON, the first and second pattern generators 39c and 39d extend the period from the time of outputting the last write data to the time of beginning a precharge of the bit lines. Specifically, a predetermined number of NOP (No Operation) commands are inserted after the outputting of the last write data until the supply of a precharge command.

The present embodiment can provide similar effects to those of the foregoing first and second embodiments. Besides, in the present embodiment, it can be easily performed to change the timing of precharging the bit lines in accordance with the mode signal MODE2 from the exterior even after the assembly of the SIP.

Figure 15:
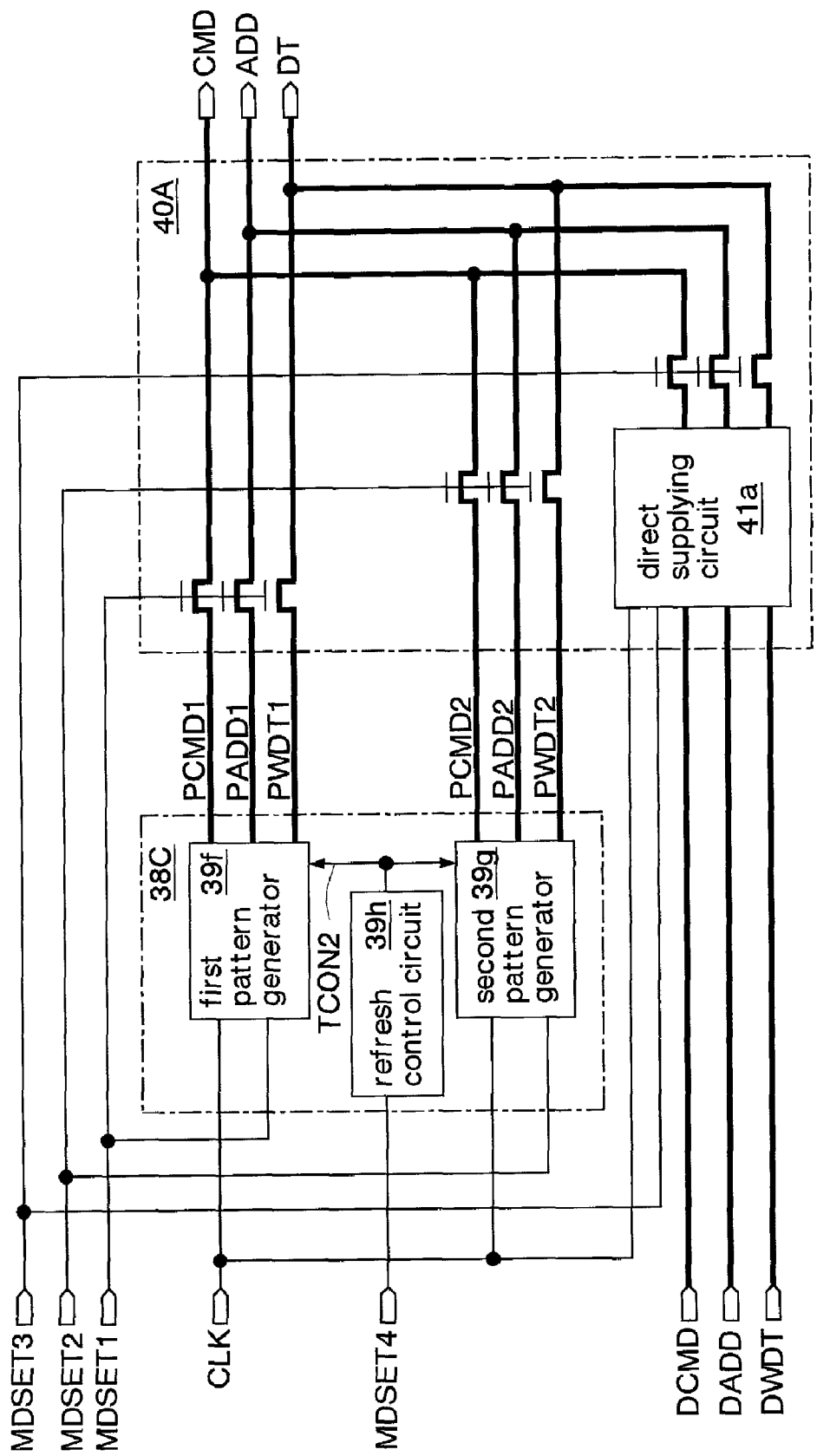
FIG. 15 is a block diagram showing the details of the pattern generator and pattern selector of the fourth embodiment of the present invention.

FIG. 15 shows a pattern generator 38C and the pattern selector 40A in a fourth embodiment of semiconductor device according to the present invention. The structures of this fourth embodiment other than the pattern generator 38C are identical to those in the third embodiment. In this embodiment, circuits and signals corresponding to those described in the foregoing first through third embodiments are identified by the same reference designations, and their detailed descriptions are omitted The pattern generator 38C has first and second pattern generators 39f and 39g and a refresh control circuit 39h. The first pattern generator 39f is activated in response to the high level of the mode setting signal MDSET1 (the first test mode) to generate the first test pattern (internal test pattern) in synchronism with the clock signal CLK. The generated internal test pattern is outputted as the command signals PCMD1, address signals PADD1 and data signals PWDT1 (write data). The second pattern generator 39g is activated in response to the high level of the mode setting signal MDSET2 (the first test mode) to generate the second test pattern (internal test pattern) in synchronism with the clock signal CLK. The generated internal test pattern is outputted as the command signals PCMD2, address signals PADD2 and data signal PWDT2 (write data).

The refresh control circuit 39*h* outputs, in response to the mode setting signal MDSET4, a timing control signal TCON2 to the first and second pattern generators 39*f* and 39*g*. In response to a high level of the timing control signal TCON2, the first and second pattern generators 39*f* and 39*g* extend the intervals at which to execute the refresh operation for the memory cells (the refresh request intervals). Specifically, a predetermined number of NOP commands are inserted between refresh requests.

The present embodiment can provide similar effects to those of the foregoing first and second embodiments. Besides, in the present embodiment, changing the refresh request intervals in accordance with the mode signal MODE2 from the exterior allows a detailed test of the memory-cell refresh characteristic (data retain characteristic) to be performed even after the package assembly.

Figure 16:
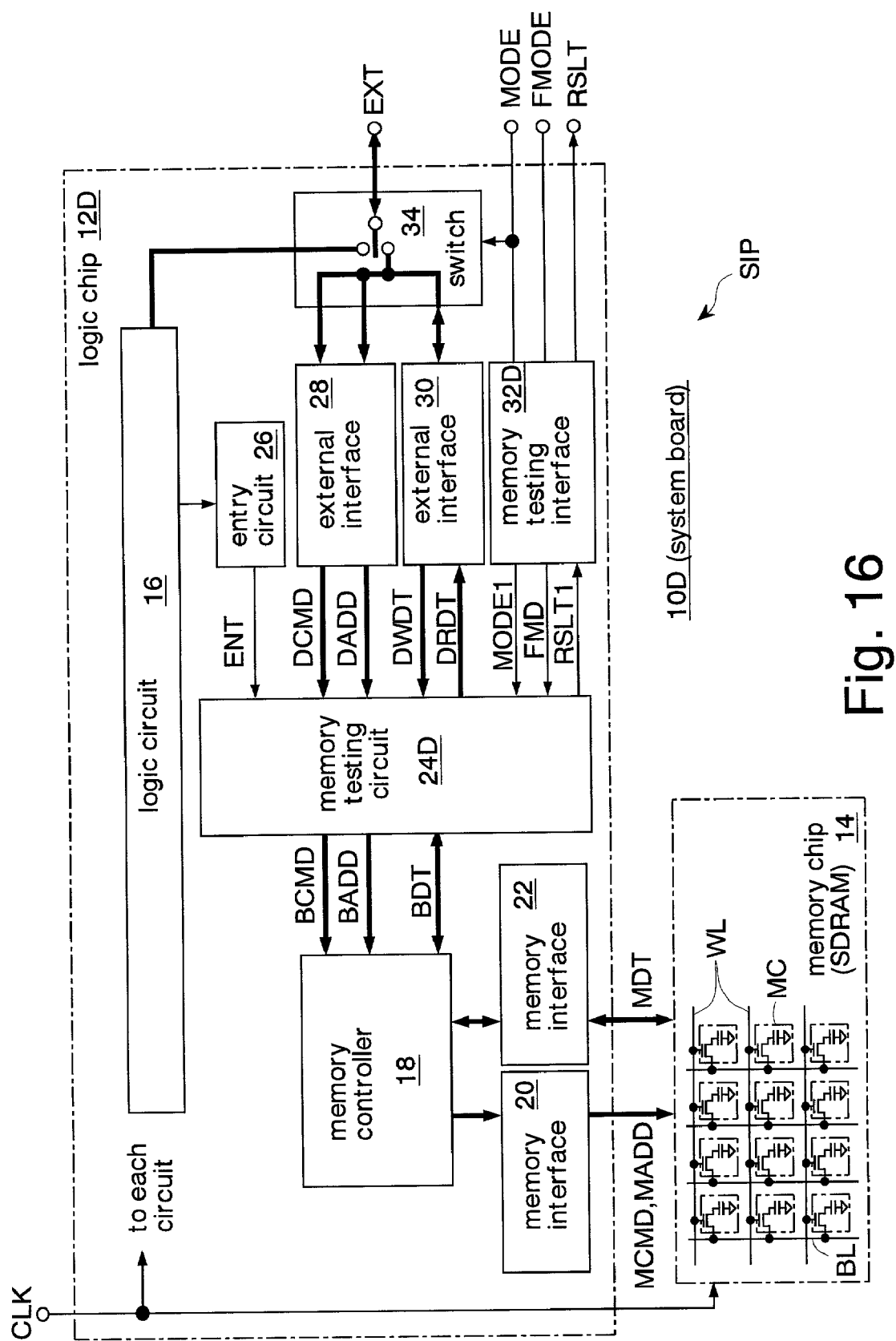
FIG. 16 is a block diagram showing the fifth embodiment of the present invention.

FIG. 16 shows the fifth embodiment of semiconductor device according to the present invention. In this embodiment, circuits and signals corresponding to those described in the foregoing first embodiment are identified by the same reference designations, and their detailed descriptions are omitted.

In this fifth embodiment, an SIP is formed by mounting a logic chip 12D and the memory chip 14 on a system board 10D. In the logic chip 12D, a memory testing circuit 24D and a memory testing interface 32D are formed in place of the memory testing circuit 24 and memory testing interface 32 of the first embodiment. The memory testing interface 32D receives a fail mode signal FMODE via a fail mode terminal and outputs the received signal as a fail mode signal FMD to the memory testing circuit 24D. Part of the external terminals EXT are first multipurpose terminals that are used as normal terminals during the normal operation and used as test terminals during the second test mode, and second multipurpose terminals that are used as test item terminals to output test items (test item signals TITEM which will be described later) during the first test mode. The other structures in the fifth embodiment are identical to those in the first embodiment.

Figure 17:
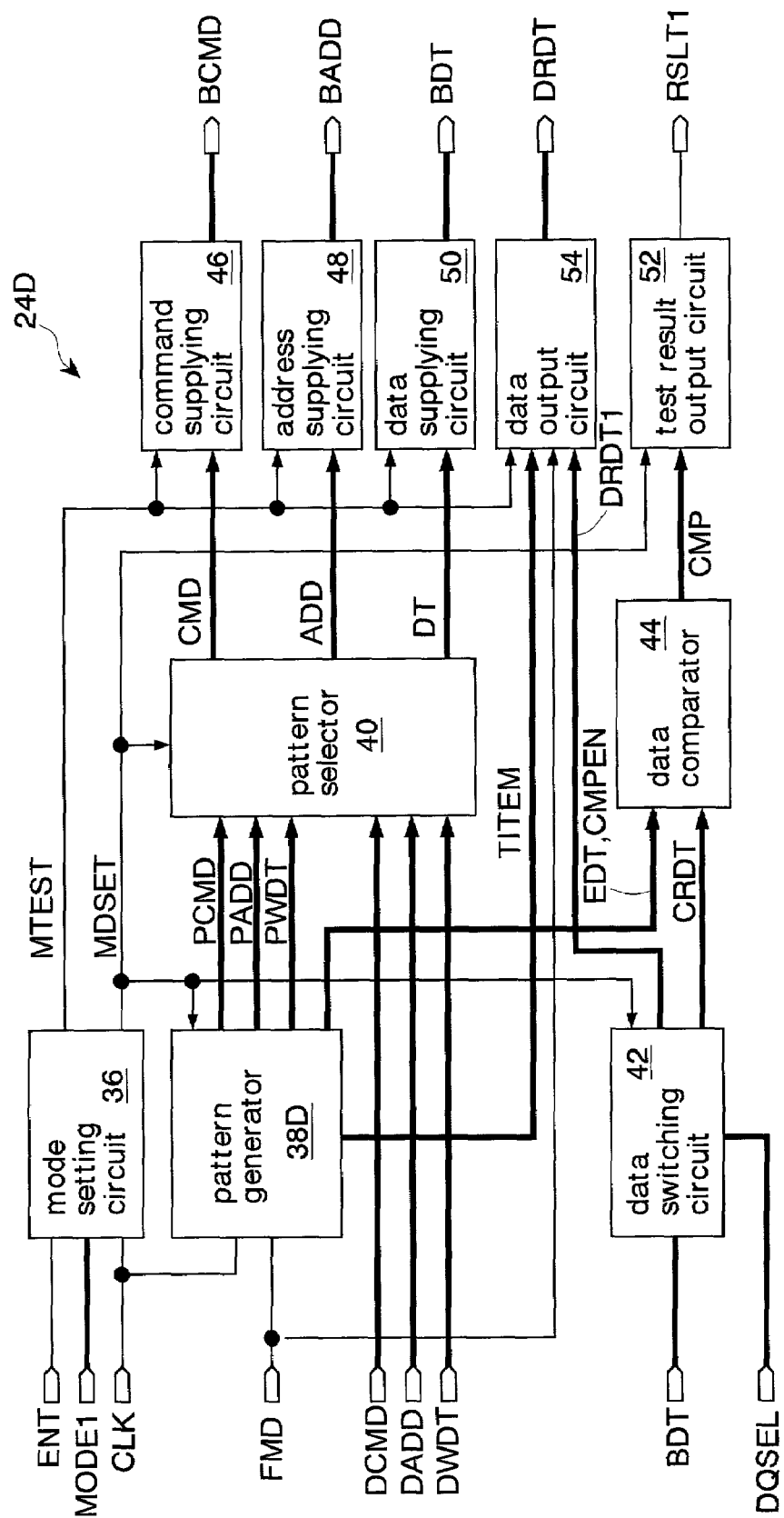
FIG. 17 is a block diagram showing the details of the memory testing circuit shown in FIG. 16.

FIG. 17 shows the details of the memory testing circuit 24D shown in FIG. 16. In the memory testing circuit 24D, a pattern generator 38D that receives the mode setting signal MDSET differs from the pattern generator 38 of the first embodiment. A data output circuit 54 is additionally formed. The other structures are identical to those in the first embodiment. During the first test mode, the pattern generator 38D and data comparator 44 operate as a fail mode selector for selecting, in response to the fail mode signal FMODE, to interrupt the tests after the first fail or to execute all the tests in spite of fail(s).

The pattern generator 38D is activated in response to the high level of the mode setting signal MDSET (the first test mode) to generate an internal test pattern, which is outputted as the command signals PCMD, address signals PADD and data signals PWDT (write data). If the fail mode signal FMD is at the low level, the pattern generator 38D stops its operation at the first fail. If the fail mode signal FMD is at the high level, the pattern generator 38D continues to generate the test pattern even when the comparison result in the data comparator 44 shows a difference. Moreover, the pattern generator 38D outputs, as the test item signals TITEM, the test items to be sequentially executed according to the internal test pattern.

The data output circuit 54 is activated when the memory testing signal MTEST is at the high level. When the fail mode signal FMD is at the low level, the data output circuit 54 outputs, as read data DRDT, read data signals DRDT1 (the second test mode) supplied from the data switching circuit 42. When the fail mode signal FMD is at the high level, the data output circuit 54 outputs, as read data DRDT, the test item signals TITEM (the first test mode) supplied from the pattern generator 38D. The test item signals TITEM are outputted in synchronism with the test result signal RSLT1 supplied from the test result output circuit 52.

Figure 18:
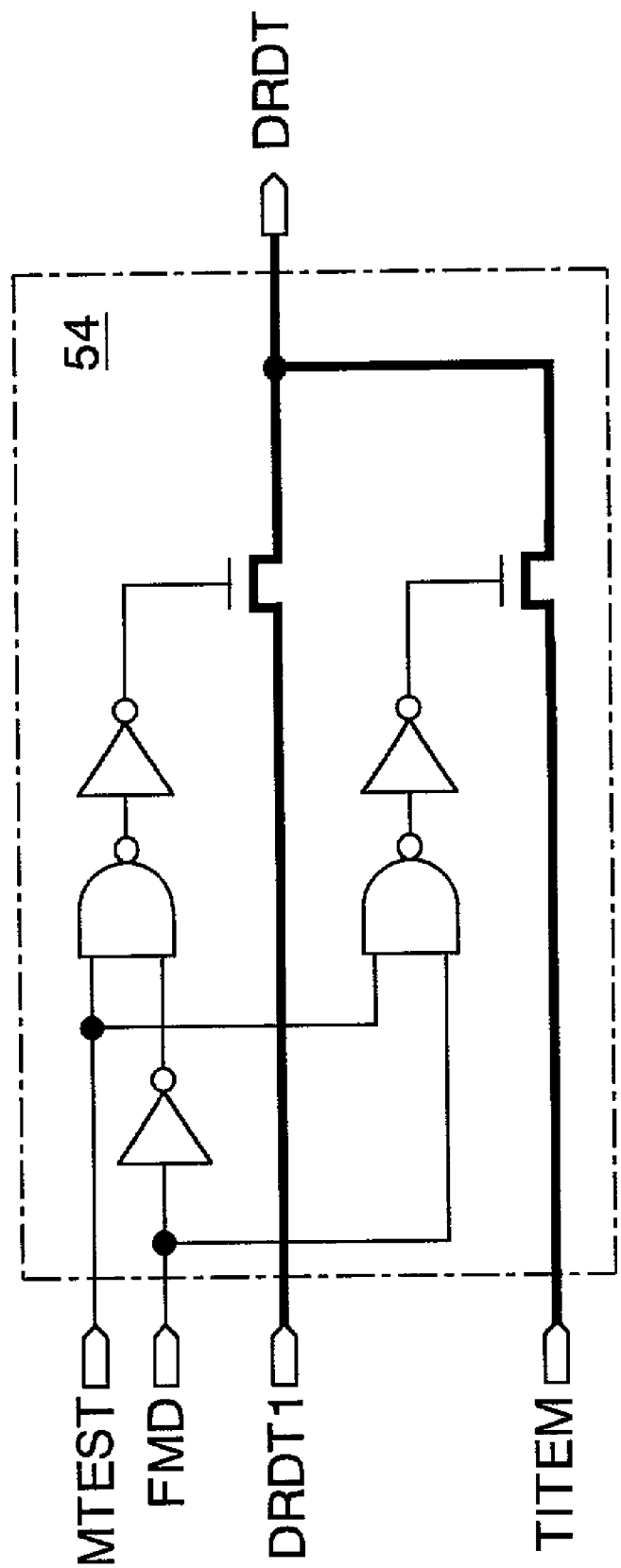
FIG. 18 is a circuit diagram showing the details of the data output circuit shown in FIG. 17.

FIG. 18 shows the details of the data output circuit 54 shown in FIG. 17. The data output circuit 54 has an nMOS transistor that is turned on to output the read data signals DRDT1 as the read data signals DRDT when the fail mode signal FMD is at the low level, and another nMOS transistor that is turned on to output the test item signals TITEM as the read data signals DRDT when the fail mode signal FMD is at the high level.

In the semiconductor device of the present embodiment, when receiving the fail mode signal FMODE (FMD) exhibiting the high level, the pattern generator 38D generates, in spite of fail(s), all the internal test patterns to execute the test of the memory chip 14 during the first test mode. Then, the logic chip 12D outputs the test item signals TITEM together with the comparison result signal RSLT (RSLT1). For this reason, it can be selected, in response to the fail mode signal FMODE, to interrupt the tests after the first fail or to execute all the tests in spite of fail(s).

The present embodiment can provide similar effects to those of the foregoing first embodiment. Besides, in the present embodiment, for example, it is possible to quickly find non-defective products by setting, during the final test following the SIP assembly, the fail mode signal FMODE to the low level and thereby interrupting the tests after the first fail. It is also possible to easily estimate the causes of memory chip defects by setting, during an analysis of the defective memory chip 14, the fail mode signal FMODE to the high level and thereby executing all the tests in spite of the fail(s).

It is also possible to shorten the test time period following a stabilization of the mass production by setting, in the beginning period of the mass production when the fraction defective is high, the fail mode signal FMODE to the high level to execute all the tests in spite of fail(s), and by setting, in the stable period of the mass production when the fraction defective is low, the fail mode signal FMODE to the low level to interrupt the tests after the first fail.

When the fail mode signal FMODE is at the high level, the test items (the test item signals TITEM) to be sequentially executed according to the internal test pattern are outputted from the test item terminals. Therefore, an LSI tester or the like that evaluates the SIP can easily recognize the test items on which fails exist.

Figure 19:
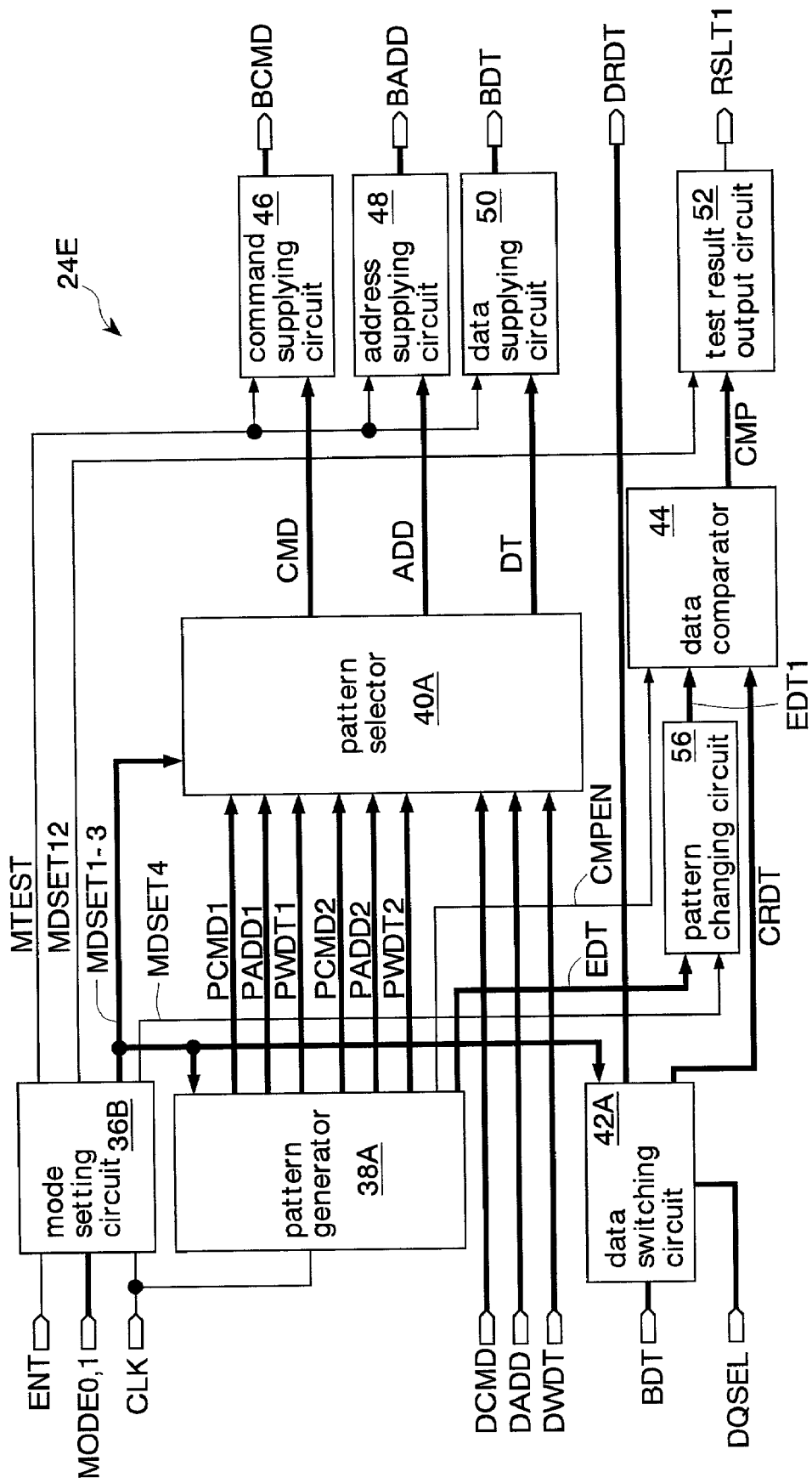
FIG. 19 is a block diagram showing the details of the memory testing circuit of the sixth embodiment of the present invention.

FIG. 19 shows a memory testing circuit 24E in the sixth embodiment of semiconductor device according to the present invention. In this embodiment, circuits and signals corresponding to those described in the foregoing first, second and third embodiments are identified by the same reference designations, and their detailed descriptions are omitted.

The memory testing circuit 24E has the mode setting circuit 36B (as in the third embodiment), the pattern generator 38A (as in the second embodiment), the pattern selector 40A (as in the second embodiment), the data switching circuit 42A (as in the second embodiment), the data comparator 44 (as in the first embodiment), the command supplying circuit 46 (as in the first embodiment), the address supplying circuit 48 (as in the first embodiment), the data supplying circuit 50 (as in the first embodiment), the test result output circuit 52 (as in the first embodiment), and, as a new additional circuit, a pattern changing circuit 56 that receives expected data EDT from the pattern generator 38A.

Figure 20:
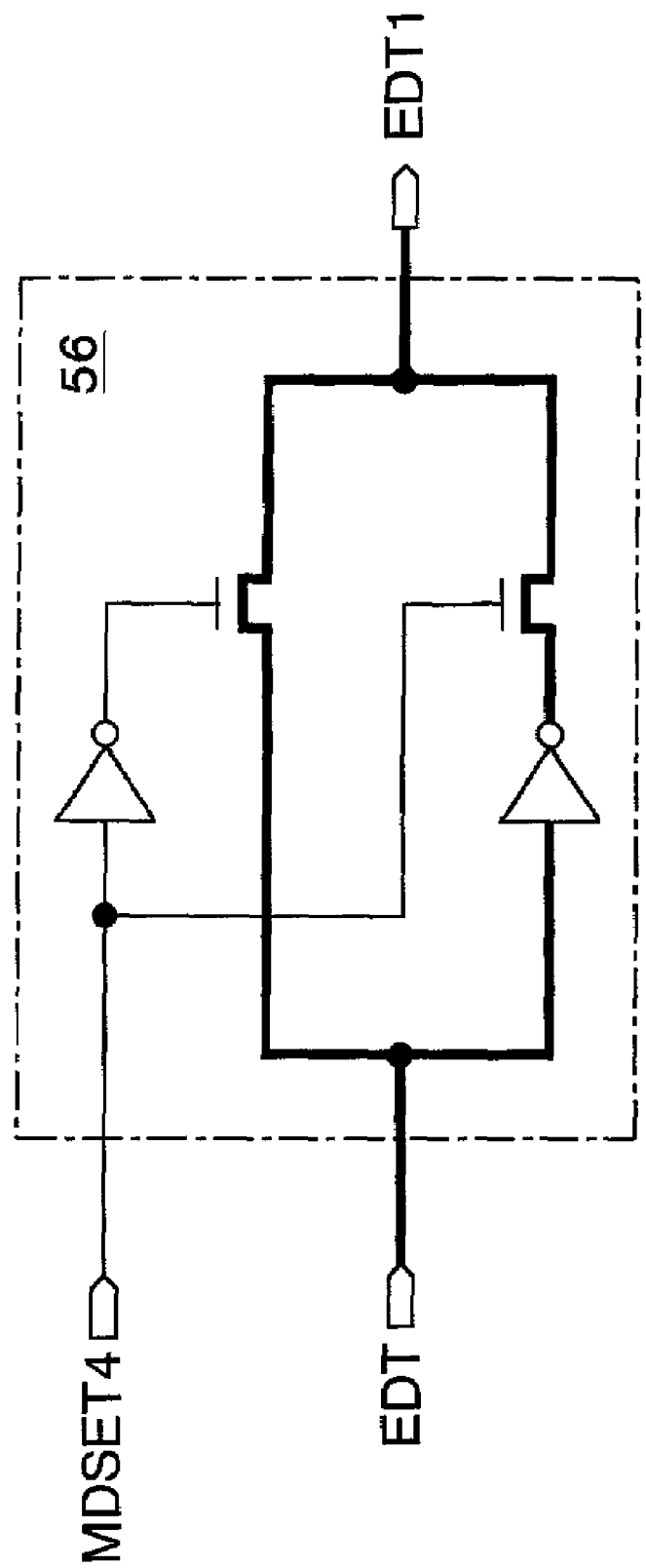
FIG. 20 is a circuit diagram showing the details of the pattern changing circuit shown in FIG. 19.

FIG. 20 shows the details of the pattern changing circuit 56 shown in FIG. 19. The pattern changing circuit 56 has an nMOS transistor that is turned on in response to the low level of the mode setting signal MDSET4 to output the expected data EDT as expected data EDT1, and another nMOS transistor that is turned on in response to the high level of the mode setting signal MDSET4 to output the inverted level of the expected data EDT as expected data EDT1. The mode setting signal MDSET4 varies in accordance with the mode signal MODE2, as in the third embodiment. The mode signal MODE2 serves as a pattern changing signal that inverts the expected data, as will be described later, while the mode terminal that receives the mode signal MODE2 (MODE) serves as a pattern changing terminal. The expected data EDT1 is transmitted to the data comparator 44 and compared with the read data signals CRDT from the data switching circuit 42A.

In the present embodiment, when the mode setting signal MDSET4 is at the high level, the data comparator 44 compares the inverted level of the expected data EDT with the read data signals CRDT. At this moment, even if the memory chip 14 is correctly operating, all the tests always fail. As a result, if a failure occurs in any circuit in the logic chip that operates in the first test mode and even if the comparison result always passes (for example, a zero stack failure of the comparison result signal CMP outputted from the data comparator 44), then the failure can be detected. Specifically, if the memory chip 14 is tested by use of the first test mode with the mode setting signal MDSET4 successively set to the low level and then to the high level and if the comparison result passes in terms of both levels, then a defect of the logic chip is detected.

The present embodiment can provide similar effects to those of the foregoing first and second embodiments. Besides, in the present embodiment, it is possible to detect not only any defect of the memory chip 14 but also any defect of the logic chip.

The foregoing first embodiment was described as an example where the SIP was formed by mounting the logic chip 12 and memory chip 14 on the system board 10. The present invention is not limited to such an embodiment. For example, the SIP may be formed by directly connecting the logic chip to the memory chip via bumps.

The foregoing first embodiment was described as an example where either the first test pattern or the second test pattern that was constituted by adding a different test pattern to the first test pattern was outputted to the memory chip 14. The present invention is not limited to such an embodiment. For example, either a first test pattern not including a dummy write pattern that writes data into a memory cell adjacent to a watched memory cell in the memory chip 14 or a second test pattern including such a dummy write pattern may be outputted to the memory chip 14. In such a case, the dummy write pattern allows the interference between those adjacent memory cells to be checked. For this reason, for example, it is possible to minimize the cost required for the final test by performing the test, using the second test pattern including the dummy write pattern when the manufacturing condition varies, and using the first test pattern when the manufacturing condition is stable.

The foregoing second embodiment was described as an example where the second test pattern including the first test pattern was formed so as to shorten the test time. The present invention is not limited to such an embodiment. For example, if memory chips whose capacities are different according to an SIP specification are mounted, then first and second test patterns may be formed for a respective particular memory chip. Also, if memory chips of different types are mounted, then first and second test patterns may be formed for a respective particular memory chip.

Figure 21:
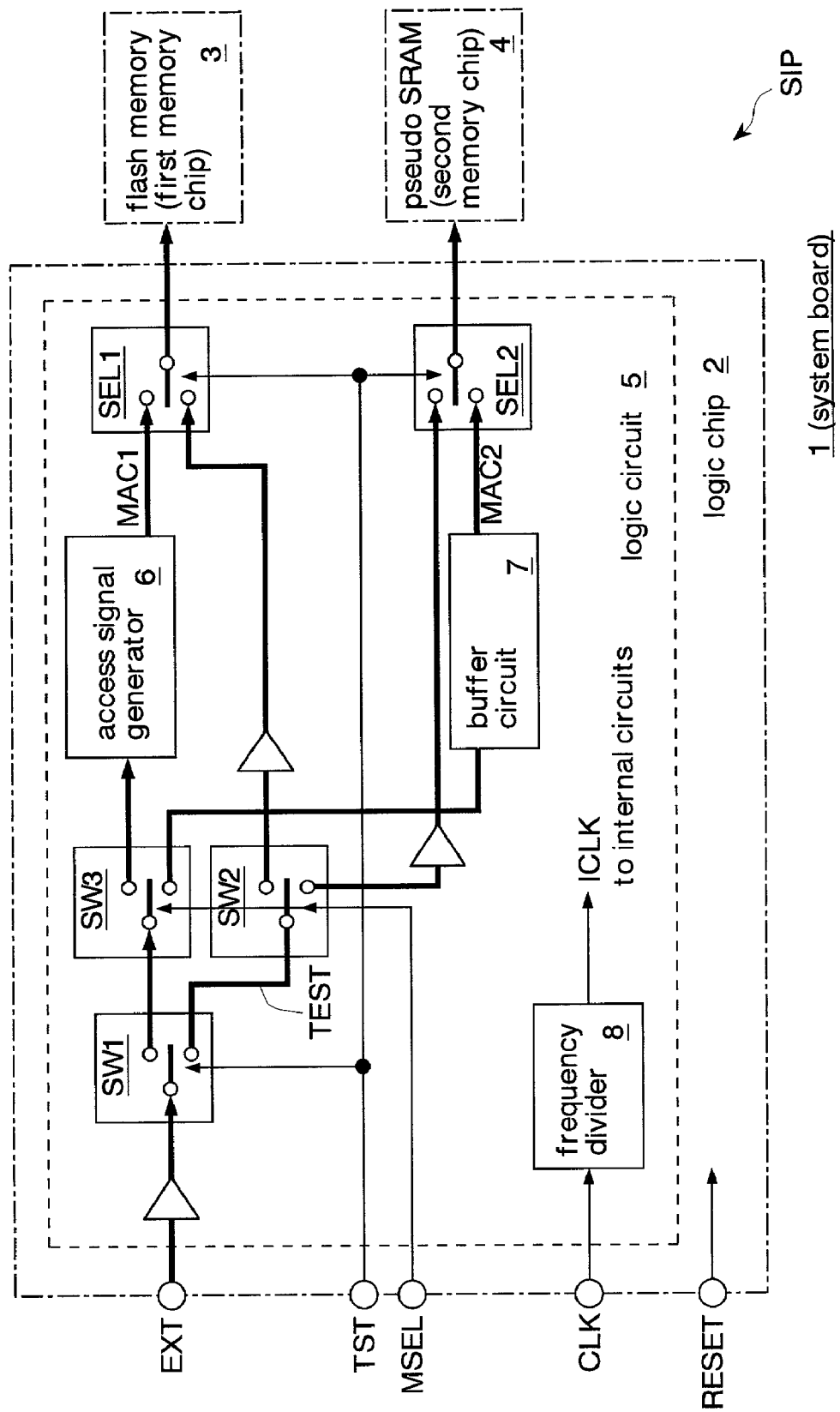
FIG. 21 is a block diagram showing the seventh embodiment of the present invention.

FIG. 21 shows the seventh embodiment of semiconductor device according to the present invention. This semiconductor device is formed, as a system-in-package (hereinafter simply referred to as SIP), by mounting a logic chip 2, a NAND flash memory 3 (a first memory chip) and a pseudo SRAM 4 (a second memory chip) on a system board 1. In FIG. 21, circles shown on the periphery of the logic chip 2 designate external terminals, and signal lines designated by thick lines each consist of a plurality of signal lines. The logic chip 2 has a logic circuit 5 that controls the access to the flash memory 3 and to the pseudo SRAM 4. The pseudo SRAM 4 includes DRAM memory cells and operates as SRAM by internally automatically refreshing those memory cells.

The logic chip 2 has external terminals EDT, a test starting terminal TST, a memory selecting terminal MSEL, a clock terminal CLK, and a hardware reset terminal RESET. Signals supplied via these terminals will be identified by the same reference designations as these terminals hereinafter. The external terminals EXT receive external signals EXT (address signals, data signals, command signals and so on) supplied from the exterior of the SIP so as to access the flash memory 3 and the pseudo SRAM 4. The test starting terminal TST receives a test starting signal TST that is activated at a testing of the flash memory 3 or the pseudo SRAM 4. When the test starting signal TST is at a high level, the logic circuit 5 recognizes that the test starting signal TST is activated.

The memory selecting terminal MSEL receives a memory selecting signal MSEL for selecting the flash memory 3 or pseudo SRAM 4 to be accessed. When the memory selecting signal MSEL is at a high or low level, the flash memory 3 or the pseudo SRAM 4 is selected, respectively. The clock terminal CLK receives a clock signal CLK (system clock) from the SIP exterior. The hardware reset terminal RESET receives a hardware reset signal RESET from the SIP exterior.

The logic circuit 5 has a first switching circuit SW1, a second switching circuit SW2, a third switching circuit SW3, a first selector SEL1, a second selector SEL2, an access signal generator 6, a buffer circuit 7 and a frequency divider 8 (a clock converter). Buffers (designated by triangles in FIG. 21) are inserted between circuit elements in view of the signal line lengths, the circuit drive capabilities and so on.

The first switching circuit SW1 transmits the external signals EXT to the third switching circuit SW3 when the test starting signal TST is at the low level; while the first switching circuit SW1 transmits the external signals EXT as test signals TEST to the second switching circuit SW2 when the test starting signal TST is at the high level. The second switching circuit SW2 transmits the test signals TEST to the first selector SEL1 when the memory selecting signal MSEL is at the high level; while the second switching circuit SW2 transmits the test signals TEST to the second selector SEL2 when the memory selecting signal MSEL is at the low level. The third switching circuit SW3 transmits the external signals EXT to the access signal generator 6 when the memory selecting signal MSEL is at the high level; while the third switching circuit SW3 transmits the external signals EXT to the buffer circuit 7 when the memory selecting signal MSEL is at the low level.

During the normal operation, in order to access the flash memory 3, the access signal generator 6 converts the external signals EXT supplied from the SIP exterior to memory access signals MAC1 that match with the interface of the flash memory 3. The memory access signals MAC1 are supplied to the flash memory 3 via the first selector SEL1.

The first selector SEL1 transmits the memory access signals MAC1 to the flash memory 3 when the test starting signal TST is at the low level; while the first selector SEL1 transmits the test signals TEST to the flash memory 3 when the test starting signal TST is at the high level.

During the normal operation, the buffer circuit 7 adjusts the timing of the external signals EXT supplied via the first switching circuit SW1 and outputs the timing-adjusted signals, as memory access signals MAC2 that access the pseudo SRAM 4, to the second selector SEL2. The second selector SEL2 transmits the outputs from the buffer circuit 7 to the pseudo SRAM 4 when the test starting signal TST is at the low level; while the second selector SEL2 transmits the test signals TEST to the pseudo SRAM 4 when the test starting signal TST is at the high level.

The frequency divider 8 divides the clock signal CLK in frequency by, for example, two to produce an internal clock signal ICLK to be used in the logic circuit 5. The internal clock signal ICLK is supplied to the access signal generator 6, to the buffer circuit 7 and to others. The flash memory 3 and pseudo SRAM 4 are clock asynchronous, but the signals to access the flash memory 3 and pseudo SRAM 4 are produced in synchronism with the internal clock signal ICLK. The frequency divider 8 allows the flash memory 3 and pseudo SRAM 4 to operate at a predetermined frequency independently of the frequency of the system clock of the system that controls the SIP.

Figure 22:
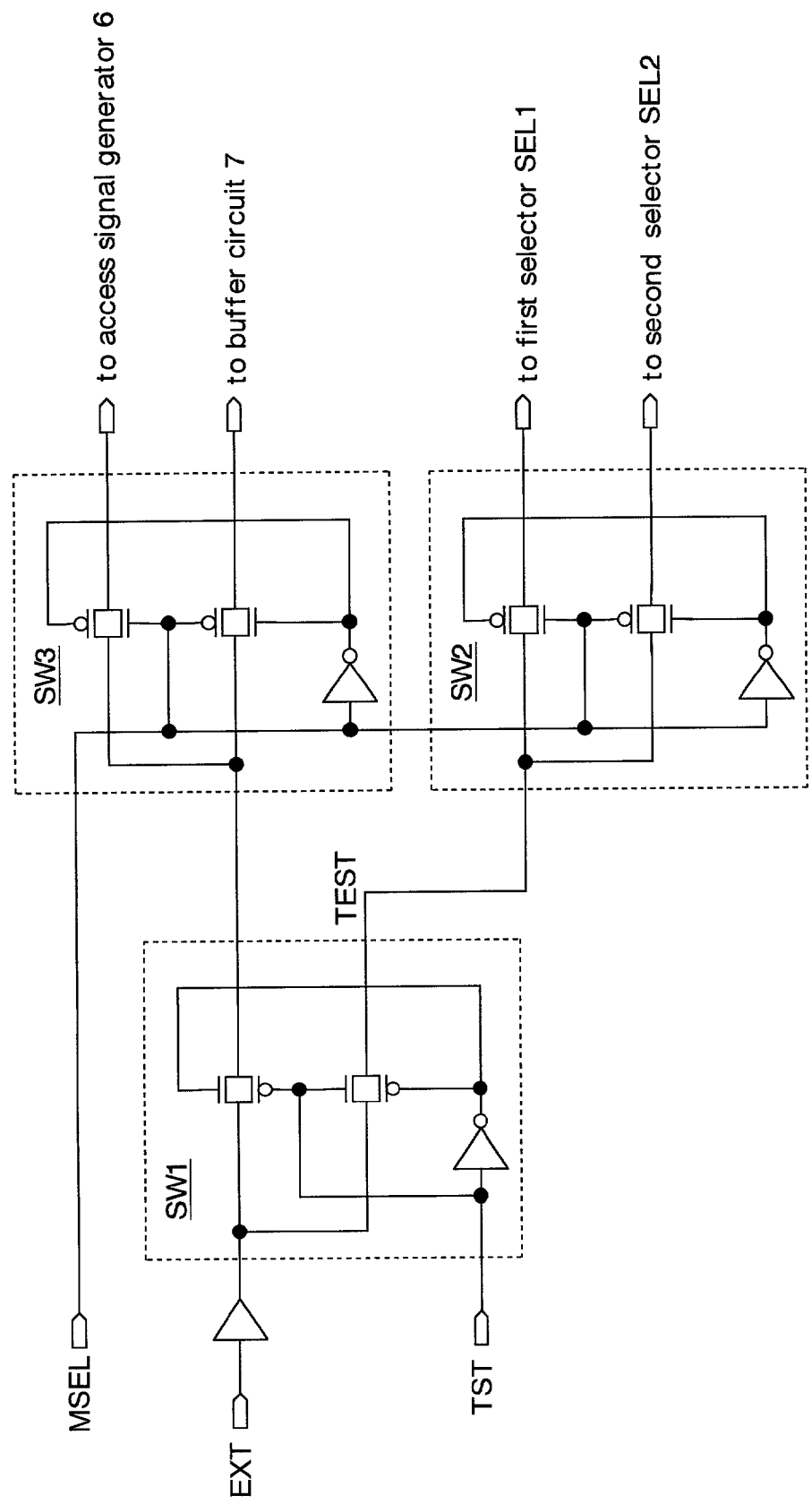
FIG. 22 is a circuit diagram showing the details of the first, second, and third switching circuits shown in FIG. 21.

FIG. 22 shows the details of the first, second and third switching circuits SW1, SW2, and SW3 shown in FIG. 21. The first, second and third switching circuits SW1, SW2, and SW3 each include two CMOS transmission gates and an inverter that controls these CMOS transmission gates.

Figure 23:
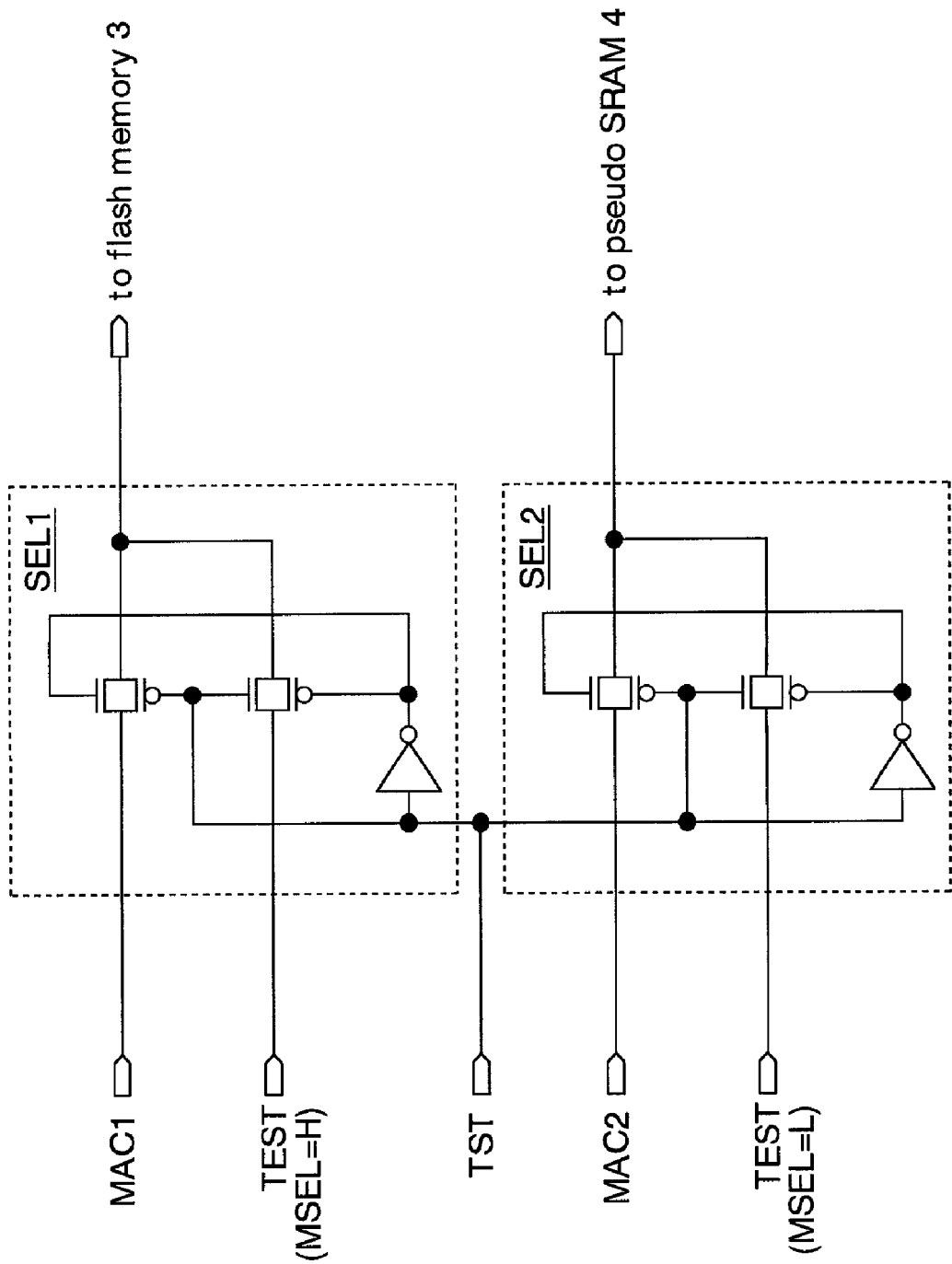
FIG. 23 is a circuit diagram showing the details of the first and second selectors shown in FIG. 21.

FIG. 23 shows the details of the first and second selectors SEL1 and SEL2 shown in FIG. 21. The first and second selectors SEL1 and SEL2 each include two CMOS transmission gates and an inverter that controls these CMOS transmission gates.

FIG. 24 shows the correspondences between the external signals EXT and the signals to be supplied to the flash memory 3 and pseudo SRAM 4. This example will be described below with respect to a read operation.

During the normal operation mode, the system that accesses the flash memory 3 inputs, as the external signals EXT, address signals AD0–23, a chip enable signal /CE1, an output enable signal /OE and a write enable signal /WE to the SIP, and inputs/retrieves data signals DQ0–15 to/from the SIP. The timings and sequence of these signals are not those matching with the interface of the flash memory 3. FIG. 21 omits the output paths of the data signals DQ0–15.

The inputted external signals EXT are supplied to the access signal generator 6 via the first switching circuit SW1 shown in FIG. 21. The access signal generator 6 produces based on the received signals, signals for accessing the flash memory 3. That is, the access signal generator 6 converts the external signals EXT supplied to the logic chip 2 to signals matching with the interface of the flash memory 3. The access signal generator 6 outputs the data signals DQ0–15 and address signals AD0–23 as data signals I/O0–15, and also outputs the chip enable signal /CE1, output enable signal /OE and write enable signal /WE as a chip enable signal /CE, a read enable signal /RE and the write enable signal /WE, respectively. Also, the access signal generator 6 produces, based on the received signals, an address latch enable signal ALE, a command latch enable signal CLE, a write protect signal /WP, and a spare area enable signal /SE and outputs these produced signals to the flash memory 3.

On the other hand, during the test mode, the system that accesses the flash memory 3 inputs to the SIP, as external signals EXT, the data signals DQ0–15, the address signal AD22, the address signal AD23, the chip enable signal /CE1, an upper byte control signal /UB, a lower byte control signal /LB, the output enable signal /OE and the write enable signal /WE, which are supplied to the flash memory 3 as the data signals I/O0–15, the address latch enable signal ALE, the command latch enable signal CLE, the chip enable signal /CE, the write protect signal /WP, the spare area enable signal /SE, the read enable signal /RE and the write enable signal /WE, respectively. The timings and sequence of these signals are those matching with the interface of the flash memory 3. That is, the signals (commands and others) to access the flash memory 3 are directly supplied from the SIP exterior. In other words, the external system can directly access the flash memory 3.

During the test mode, the connection between the external terminals EXT and the access signal generator 6 is cut off by the first switching circuit SW1. That is, the test signals TEST are not supplied to the access signal generator 6. Since the levels of the input signals to the access signal generator 6 do not vary, the inside of the access signal generator 6 remains static.

On the other hand, during both the normal operation and test modes, the system that accesses the pseudo SRAM 4 inputs to the SIP, as the external signals EXT, the data signals DQ0–15, the address signals AD0–23, the chip enable signals /CE, /CE1 and CE2, the upper byte control signal /UB, the lower byte control signal /LB, the output enable signal /OE and the write enable signal /WE. During the normal operation mode, the external signals EXT inputted to the SIP are adjusted in timing by the buffer circuit 7 shown in FIG. 21 and to the pseudo SRAM 4. During the test mode, the external signals EXT inputted to the SIP are directly supplied to the pseudo SRAM 4 via the first switching circuit SW1 and second selector SEL2.

In the present embodiment, during the normal operation mode, when the system accesses the flash memory 3, the test starting signal TST is caused to exhibit the low level, while the memory selecting signal MSEL is caused to exhibit the high level. The external signals EXT supplied so as to access the flash memory 3 are supplied to the access signal generator 6 via the first and third switching circuits SW1 and SW3. Then, the memory access signals MAC1 produced by the access signal generator 6 are supplied to the flash memory 3, so that the flash memory 3 operates.

In the test mode, when the system directly applies the external signals EXT to the flash memory 3 to test the flash memory 3, the test starting signal TST and memory selecting signal MSEL are caused to exhibit their respective high levels. The test signals TEST (external signals EXT) supplied from the exterior so as to access the flash memory 3 are directly supplied to the flash memory 3 via the first and second switching circuits SW1 and SW2 and first selector SEL1. Then, the flash memory 3 is tested.

On the other hand, in the normal operation mode, when the system accesses the pseudo SRAM 4, the test starting signal TST and memory selecting signal MSEL are caused to exhibit their respective low levels. The external signals EXT supplied so as to access the pseudo SRAM 4 are supplied to the buffer circuit 7 via the first and third switching circuits SW1 and SW3. Then, the buffer circuit 7 adjusts the received signals in timing and outputs them as the memory access signals MAC2, which are supplied to the pseudo SRAM 4, so that the pseudo SRAM 4 operates.

In the test mode, when the system directly applies the external signals EXT to the pseudo SRAM 4 to test the pseudo SRAM 4, the test starting signal TST and memory selecting signal MSEL are caused to exhibit the high and low levels, respectively. The test signals TEST (external signals EXT) supplied from the exterior so as to access the pseudo SRAM 4 are directly supplied to the pseudo SRAM 4 via the first and second switching circuits SW1 and SW2 and second selector SEL2. Then, the pseudo SRAM 4 is tested.

As can be seen from the above, in the present embodiment, during the test mode, the external signals EXT (test signals) can be directly supplied to the flash memory 3 or to the pseudo SRAM 4 without being supplied through any logic circuits or the like in the logic chip 2. In other words, the paths for transmitting the test signals TEST within the logic chip 2 only include the first and second switching circuits SW1 and SW2 (each formed by the CMOS transmission gates), the first and second selectors SEL1 and SEL2 (each also formed by the CMOS transmission gates), and the buffers (designated by the triangles in FIG. 21). For this reason, the test signals TEST can be transmitted to the flash memory 3 or to the pseudo SRAM 4 with hardly being delayed in the logic circuit 5.

The test signals TEST composed by a plurality of bits are transmitted through the same circuit paths (the first and second switching circuits SW1 and SW2, one buffer and the first selector SEL1; or the first and second switching circuits SW1 and SW2, one buffer and the second selector SEL2). This can prevent the test signals TEST from deviate in timing from one anther within the logic circuit 5. As a result, detailed tests can be executed with precise timings.

During the test mode, the external signals EXT can be directly supplied to the flash memory 3 without any necessity for the access signal generator 6 to perform a command conversion of the external signals EXT. For this reason, the test program used in the proof test of the flash memory 3 can also be used in the test of the SIP. As a result, the test cost can be reduced.

During the test mode, the first switching circuit SW1 and test starting signal TST do not act to supply the test signals TEST to the access signal generator 6. This can prevent malfunction of the access signal generator 6. Also, since the levels of the input signals to the access signal generator 6 do not vary, the inside of the access signal generator 6 remains static. As a result, the power consumption during the test can be reduced.

The memory selecting signal MSEL and second switching circuit SW2 act to output the test signals TEST to either the flash memory 3 or the pseudo SRAM 4. For this reason, the flash memory 3 and the pseudo SRAM 4 can be independently tested.

The clock signal CLK supplied from the exterior is changed in frequency by the frequency divider 8 and then supplied to the internal circuits of the logic circuit 5. This allows the logic circuit 5, flash memory 3 and pseudo SRAM 4 to operate in optimum timings, without depending on the clock period of the system in which the SIP is mounted.

Figure 25:
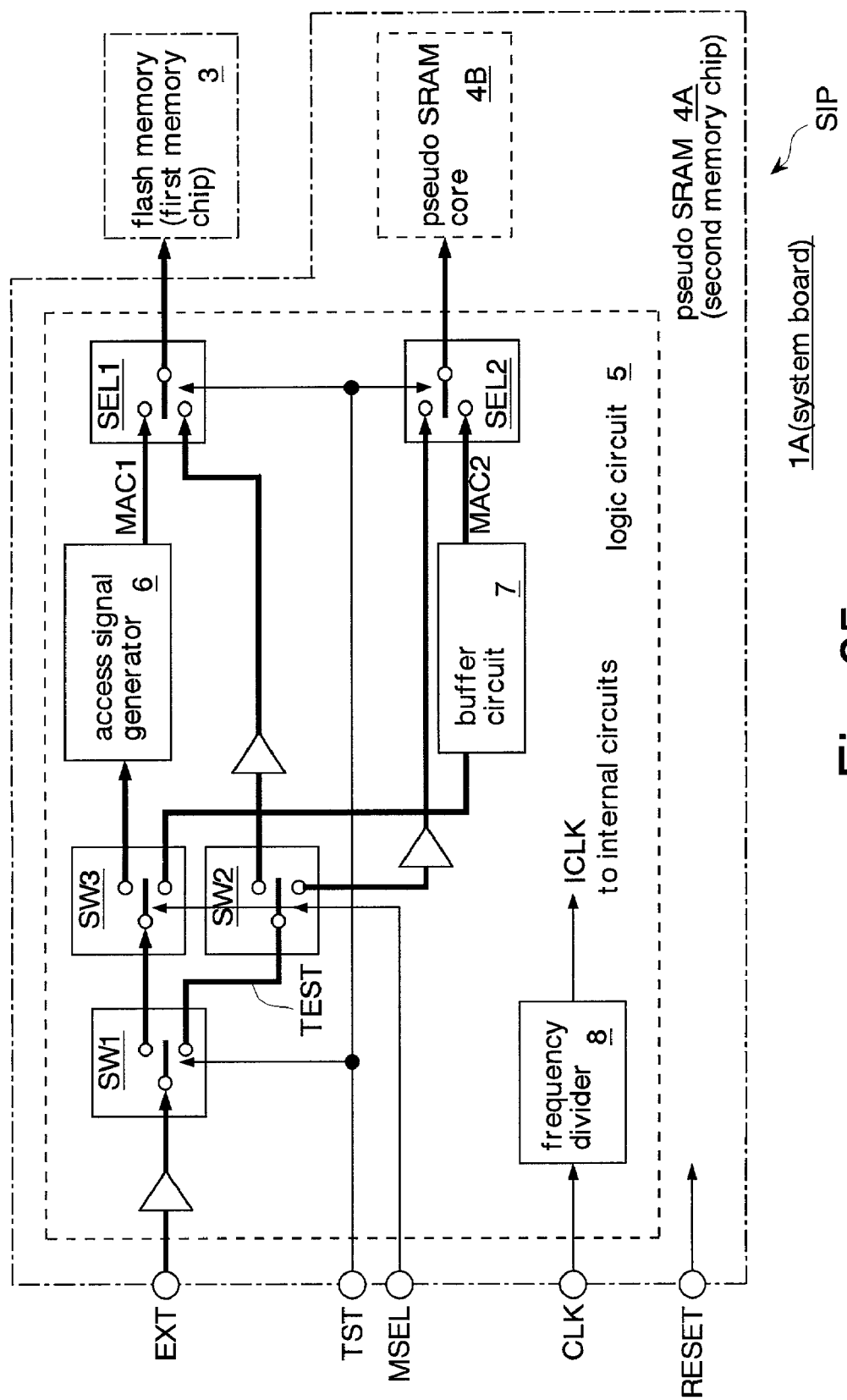
FIG. 25 is a block diagram showing the eighth embodiment of the present invention.

FIG. 25 shows the eighth embodiment of semiconductor device according to the present invention. In this embodiment, circuits and signals corresponding to those described in the foregoing seventh embodiment are identified by the same reference designations, and their detailed descriptions are omitted.

In this eighth embodiment, an SIP is formed by mounting the flash memory 3 and a pseudo SRAM 4A on a system board 1A. The pseudo SRAM 4A has a pseudo SRAM core 4B and the same logic circuit 5 as the seventh embodiment. That is, the logic circuit 5 that controls the flash memory 3 and pseudo SRAM core 4B is formed in the pseudo SRAM 4A. The pseudo SRAM core 4B has the same capacity and terminals as the pseudo SRAM 4 of the seventh embodiment. The other structures of the eighth embodiment are identical to those of the seventh embodiment.

The present embodiment can provide similar effects to those of the foregoing seventh embodiment.

Figure 26:
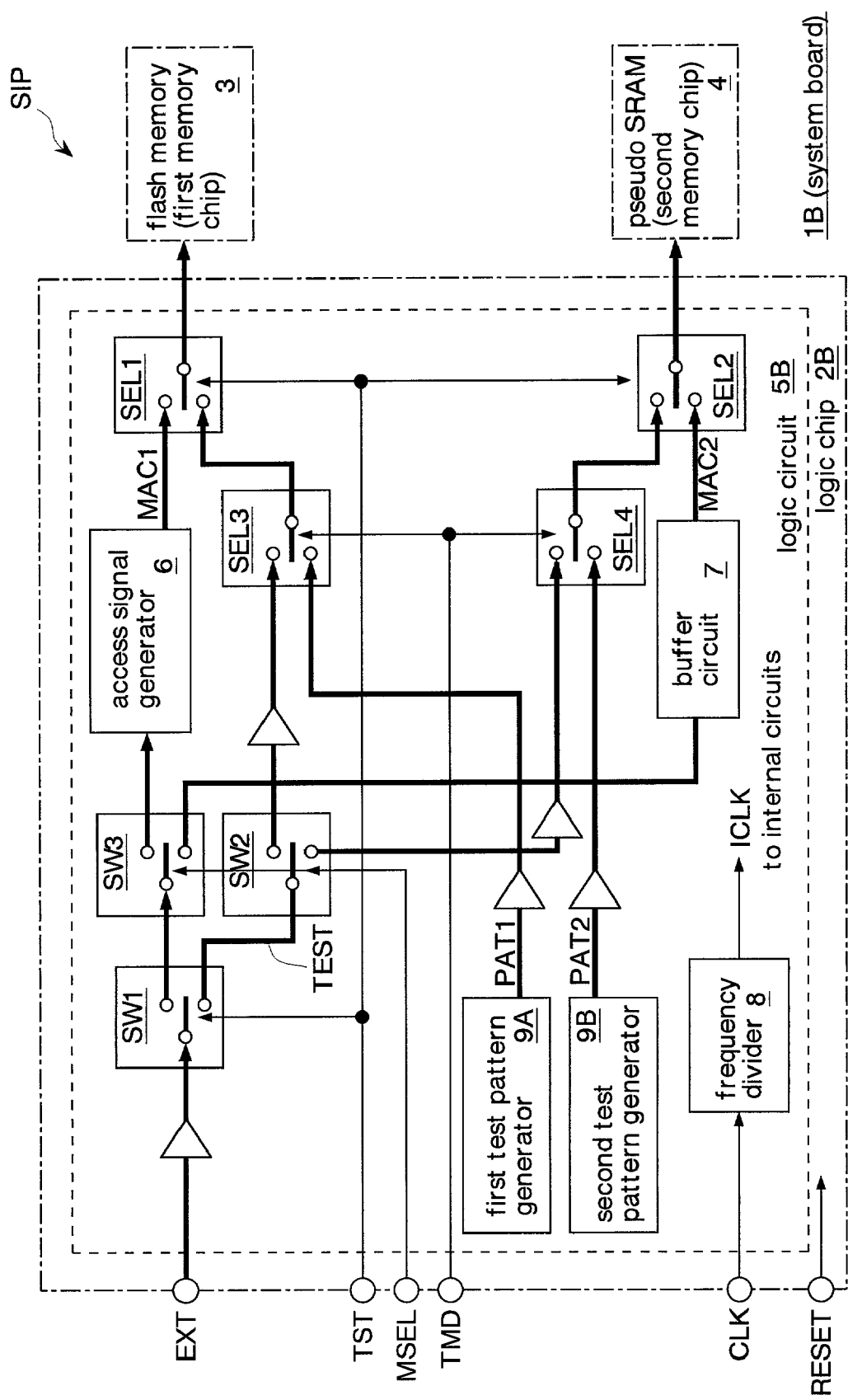
FIG. 26 is a block diagram showing the ninth embodiment of the present invention.

FIG. 26 shows the ninth embodiment of semiconductor device according to the present invention. In this embodiment, circuits and signals corresponding to those described in the foregoing seventh embodiment are identified by the same reference designations, and their detailed descriptions are omitted.

In this ninth embodiment, an SIP is formed by mounting a logic chip 2B, the flash memory 3 and the pseudo SRAM 4 on a system board 1B. The logic chip 2B has a logic circuit 5B. The logic chip 2B has a test mode terminal TMD, which receives a test mode signal TMD that selects either using the external signals EXT or using a test pattern produced within the logic circuit 5B to test the flash memory 3 or the pseudo SRAM 4.

The logic circuit 5B is formed by adding to the logic circuit 5 of the seventh embodiment a first test pattern generator 9A, a second test pattern generator 9B, a third selector SEL3 and a fourth selector SEL4. The third selector SEL3 is disposed between the second switching circuit SW2 and the first selector SEL1. The fourth selector SEL4 is disposed between the second switching circuit SW2 and the second selector SEL2. The other structures of the ninth embodiment are identical to those of the seventh embodiment.

The first test pattern generator 9A generates first test pattern signals PAT1 for testing the flash memory 3. The second test pattern generator 9B generates second test pattern signals PAT2 for testing the pseudo SRAM 4.

The third selector SEL3 transmits to the first selector SEL1 the test signals TEST supplied via the first and second switching circuits SW1 and SW2 when the test mode signal TMD is at a low level (a first test mode). The third selector SEL3 transmits to the first selector SEL1 the first test pattern signals PAT1 when the test mode signal TMD is at a high level (a second test mode).

The fourth selector SEL4 transmits to the second selector SEL2 the test signals TEST supplied via the first and second switching circuits SW1 and SW2 when the test mode signal TMD is at the low level (the first test mode). The fourth selector SEL4 transmits to the second selector SEL2 the second test pattern signals PAT2 when the test mode signal TMD is at the high level (the second test mode).

The first and second test pattern generators 9A and 9B operate independently of each other. In other words, these generators 9A and 9B may operate separately or simultaneously.

Figure 27:
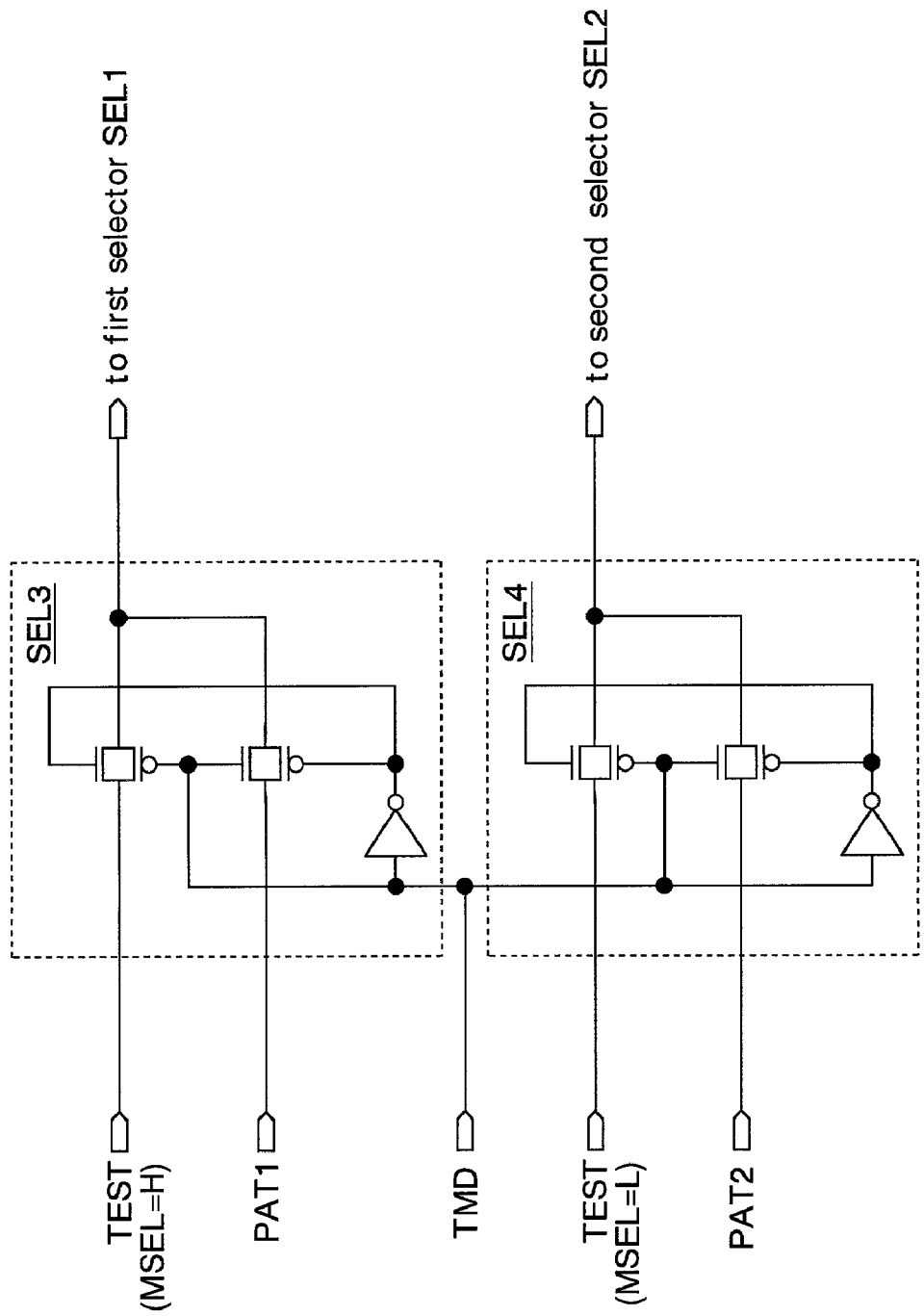
FIG. 27 is a circuit diagram showing the details of the third and fourth selectors shown in FIG. 26.

FIG. 27 shows the details of the third and fourth selectors SEL3 and SEL4 shown in FIG. 26. The third and fourth selectors SEL3 and SEL4 each include two CMOS transmission gates and an inverter that controls these CMOS transmission gates.

In the present embodiment, in the normal operation mode, when the system accesses the flash memory 3, the test starting signal TST is caused to exhibit the low level, and the memory selecting signal MSEL is caused to exhibit the high level. The test mode signal TMD may exhibit either level. The external signals EXT supplied so as to access the flash memory 3 are supplied to the access signal generator 6 via the first and third switching circuits SW1 and SW3. Then, the memory access signals MAC1 produced by the access signal generator 6 are supplied to the flash memory 3, so that the flash memory 3 operates.

In the test mode, when the system directly applies the external signals D(T to the flash memory 3 to test the flash memory 3, the test starting signal TST and memory selecting signal MSEL are caused to exhibit their respective high levels, and the test mode signal TMD is caused to exhibit the low level. The test signals TEST (external signals EXT) supplied from the exterior so as to access the flash memory 3 are directly supplied to the flash memory 3 via the first and second switching circuits SW1 and SW2 and further the third and first selectors SEL 3 and SEL1. Then, the flash memory 3 is tested.

In the test mode, when a test pattern produced within the logic circuit 5B is applied to the flash memory 3 to test the flash memory 3, the test starting signal TST and test mode signal TMD are caused to exhibit their respective high levels. The memory selecting signal MSEL may exhibit either level. Then, the system applies a test command and others to the logic chip 2B, whereby the first test pattern generator 9A operates to produce the first test pattern signals PAT1. The first test pattern signals PAT1 are supplied to the flash memory 3 via the third and first selectors SEL 3 and SEL1. Then, the flash memory 3 is tested.

On the other hand, in the normal operation mode, when the system accesses the pseudo SRAM 4, the test starting signal TST and memory selecting signal MSEL are caused to exhibit their respective low levels. The test mode signal TMD may exhibit either level. The external signals EXT supplied so as to access the pseudo SRAM 4 are supplied to the buffer circuit 7 via the first and third switching circuits SW1 and SW3. Then, the buffer circuit 7 adjusts the received signals in timing and outputs them as the memory access signals MAC2, which are supplied to the pseudo SRAM 4, so that the pseudo SRAM 4 operates.

In the test mode, when the system directly applies the external signals EXT to the pseudo SRAM 4 to test the pseudo SRAM 4, the test starting signal TST is caused to exhibit the high level, and the memory selecting signal MSEL and test mode signal TMD are caused to exhibit their respective low levels. The test signals TEST (external signals EXT) supplied from the exterior so as to access the pseudo SRAM 4 are directly supplied to the pseudo SRAM 4 via the first and second switching circuits SW1 and SW2 and further the fourth and second selectors SEL 4 and SEL2. Then, the pseudo SRAM 4 is tested.

In the test mode, when a test pattern produced within the logic circuit 5B is applied to the pseudo SRAM 4 to test the pseudo SRAM 4, the test starting signal TST and test mode signal TMD are caused to exhibit their respective high levels. The memory selecting signal MSEL may exhibit either level. Then, the system applies a test command and others to the logic chip 2B, whereby the second test pattern generator 9B operates to produce the second test pattern signals PAT2. The second test pattern signals PAT2 are supplied to the pseudo SRAM 4 via the fourth and second selectors SEL4 and SEL2. Then, the pseudo SRAM 4 is tested.

It should be noted that the first and second test pattern generators 9A and 9B might be simultaneously activated to test the flash memory 3 and pseudo SRAM 4 at the same time.

The present embodiment can provide similar effects to those of the foregoing seventh embodiment. Besides, in the present embodiment, the first and second test pattern generators 9A and 9B allow the flash memory 3 and pseudo SRAM 4 to be tested without receiving the test signals TEST from the exterior. That is, the built-in self-test (BIST) for the memory chips in the SIP can be executed.

Since the first and second test pattern generators 9A and 9B can operate independently of each other, it is possible to test the flash memory 3 and pseudo SRAM 4 separately or simultaneously. Simultaneously performing the tests can shorten the test time and reduce the test cost.

Figure 28:
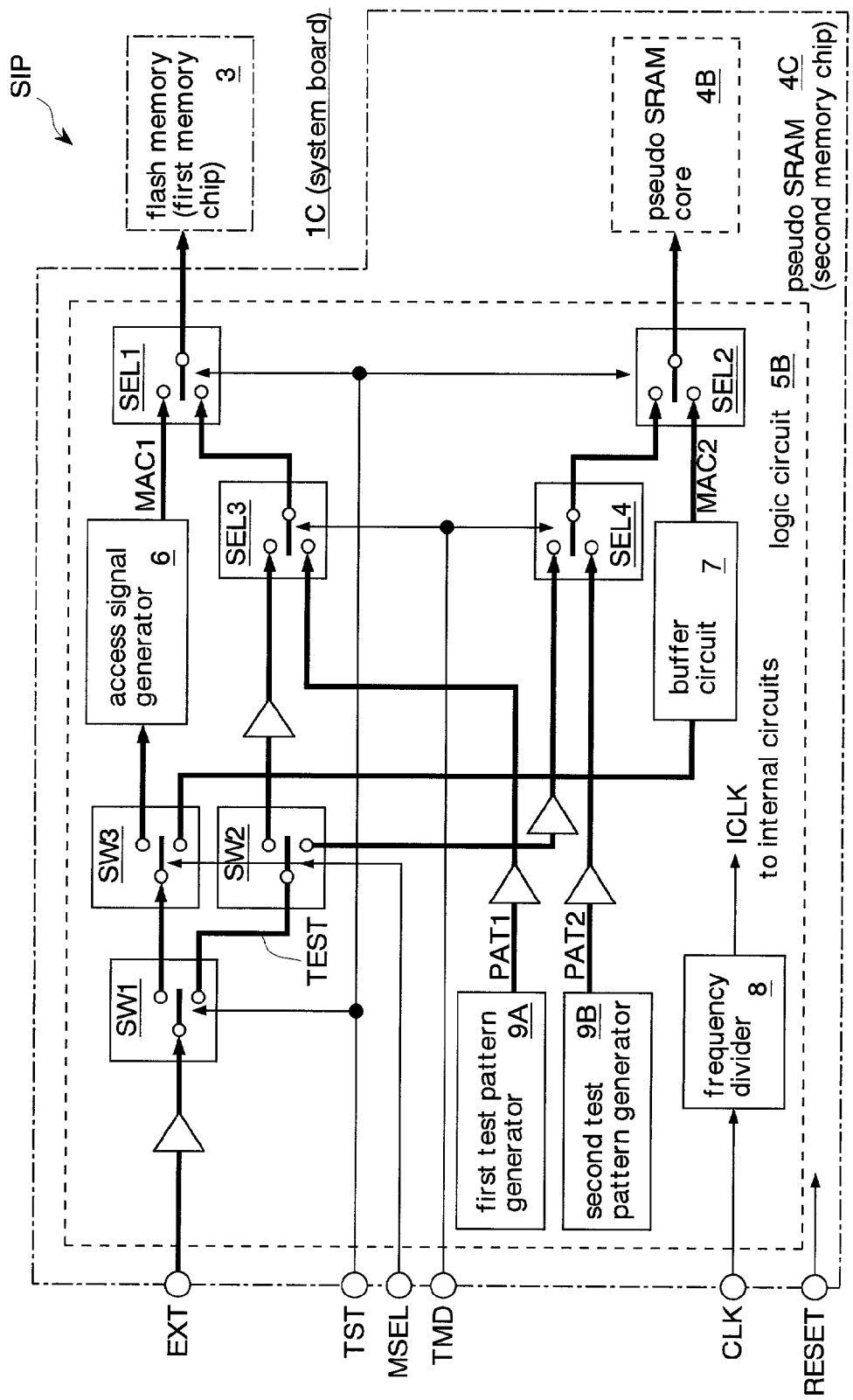
FIG. 28 is a block diagram showing the tenth embodiment of the present invention.

FIG. 28 shows the tenth embodiment of semiconductor device according to the present invention. In this embodiment, circuits and signals corresponding to those described in the foregoing first and ninth embodiments are identified by the same reference designations, and their detailed descriptions are omitted.

In this tenth embodiment, an SIP is formed by mounting the flash memory 3 and a pseudo SRAM 4C on a system board 1C. The pseudo SRAM 4C has the same logic circuit 5B as in the ninth embodiment and also has the same pseudo SRAM core 4B as in the eighth embodiment. That is, the logic circuit 5B that controls the flash memory 3 and pseudo SRAM core 4B is formed in the pseudo SRAM 4C. The other structures of the tenth embodiment are identical to those of the ninth embodiment.

The present embodiment can provide similar effects to those of the foregoing seventh embodiment.

Figure 29:
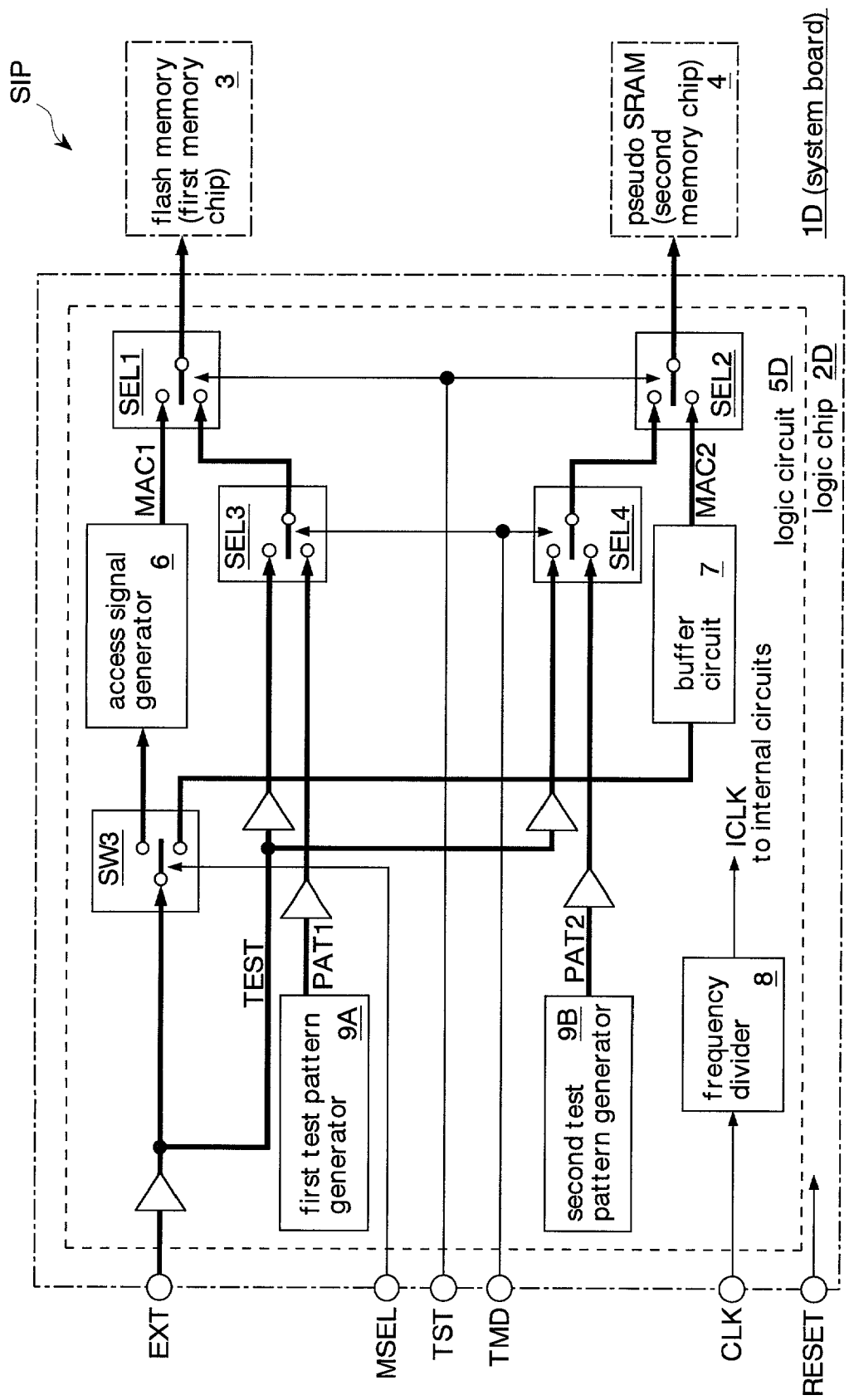
FIG. 29 is a block diagram showing the eleventh embodiment of the present invention.

FIG. 29 shows the eleventh embodiment of semiconductor device according to the present invention. In this embodiment, circuits and signals corresponding to those described in the foregoing first and ninth embodiments are identified by the same reference designations, and their detailed descriptions are omitted.

In this eleventh embodiment, a logic chip 2D having a logic circuit 5D is formed in place of the logic chip 2B of the ninth embodiment. The logic circuit 5D is constituted by removing the first and second switching circuits SW1 and SW2 from the logic circuit 5B of the ninth embodiment. The other structures of this eleventh embodiment are identical to those of the ninth embodiment.

The present embodiment can provide similar effects to those of the foregoing first and ninth embodiments.

Figure 30:
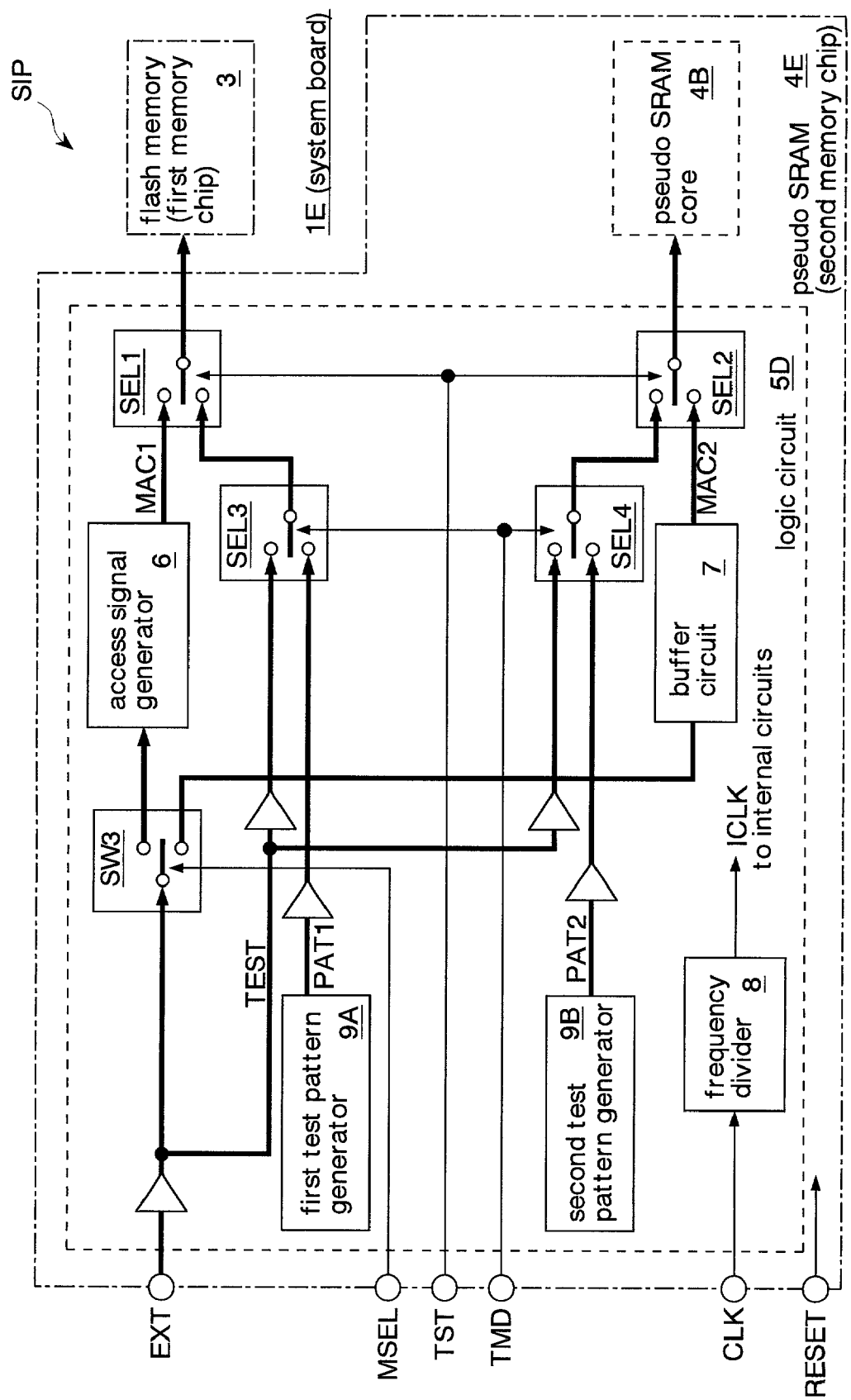
FIG. 30 is a block diagram showing the twelfth embodiment of the present invention.

FIG. 30 shows the twelfth embodiment of semiconductor device according to the present invention. In this embodiment, circuits and signals corresponding to those described in the foregoing first, second, third and eleventh embodiments are identified by the same reference designations, and their detailed descriptions are omitted.

In this twelfth embodiment, an SIP is formed by mounting the flash memory 3 and a pseudo SRAM 4E on a system board 1E. The pseudo SRAM 4E has the same logic circuit 5D as in the eleventh embodiment and also has the same pseudo SRAM core 4B as in the eighth embodiment. That is, the logic circuit 5D that controls the flash memory 3 and pseudo SRAM core 4B is formed in the pseudo SRAM 4E.

The other structures of the twelfth embodiment are identical to those of the eleventh embodiment.

The present embodiment can provide similar effects to those of the foregoing first and ninth embodiments.

Figure 31:
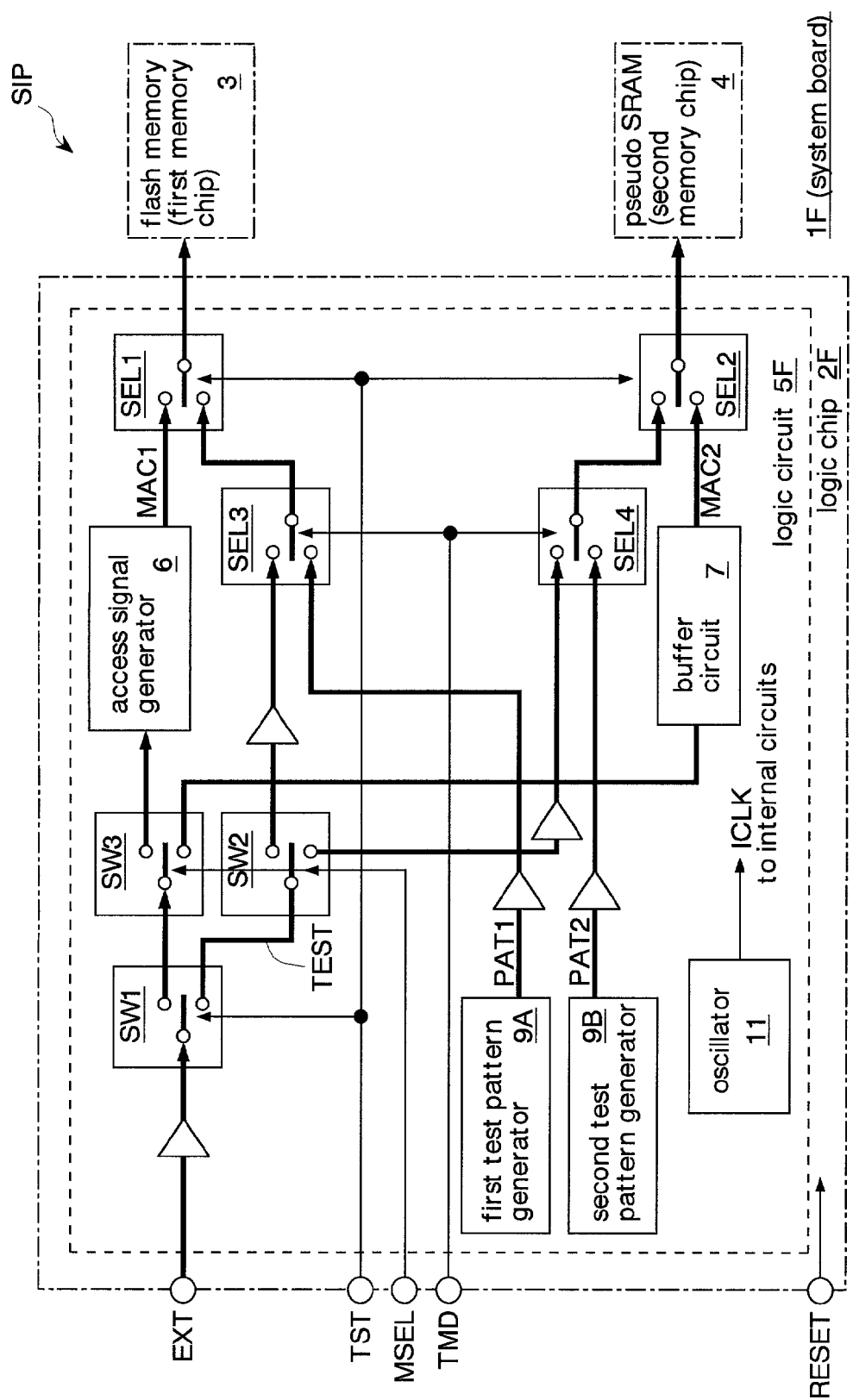
FIG. 31 is a block diagram showing the thirteenth embodiment of the present invention.

FIG. 31 shows the thirteenth embodiment of semiconductor device according to the present invention. In this embodiment, circuits and signals corresponding to those described in the foregoing first and ninth embodiments are identified by the same reference designations, and their detailed descriptions are omitted.

In this thirteenth embodiment, an SIP is formed by mounting a logic chip 2F, the flash memory 3 and the pseudo SRAM 4 on a system board 1F. The logic chip 2F has a logic circuit 5F, in which an oscillator 11 (a clock generator) that generates an internal clock signal ICLK is formed in place of the frequency divider 8 in the logic circuit 5B of the ninth embodiment. That is, the logic chip 2F and logic circuit 5F have no clock terminals. The other structures of this thirteenth embodiment are identical to those of the ninth embodiment. The internal clock signal ICLK generated by the oscillator 11 is used in the internal circuits of the logic chip 2F and logic circuit 5F.

The present embodiment can provide similar effects to those of the foregoing first and ninth embodiments. Besides, since the oscillator 11 can generate the internal clock signal ICLK within the logic circuit 5F, there is no need to provide any clock terminals for receiving a clock signal from the exterior.

Figure 32:
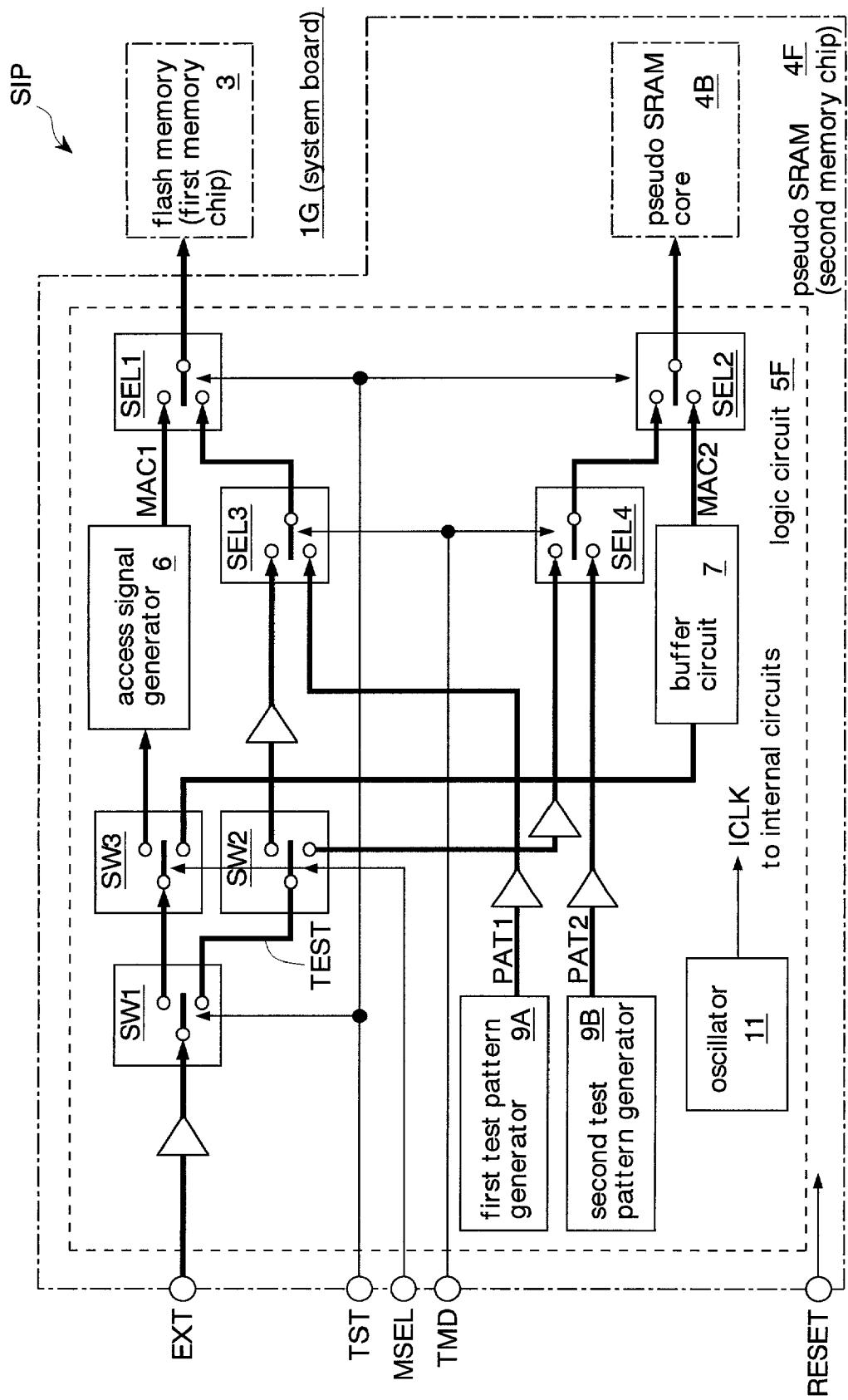
FIG. 32 is a block diagram showing the fourteenth embodiment of the present invention.

FIG. 32 shows the fourteenth embodiment of semiconductor device according to the present invention. In this embodiment, circuits and signals corresponding to those described in the foregoing first, third and thirteenth embodiments are identified by the same reference designations, and their detailed descriptions are omitted.

In this fourteenth embodiment, an SIP is formed by mounting the flash memory 3 and a pseudo SRAM 4F on a system board 1G. The pseudo SRAM 4F has the same logic circuit 5F as in the thirteenth embodiment and also has the same pseudo SRAM core 4B as in the eighth embodiment. That is, the logic circuit 5F that controls the flash memory 3 and pseudo SRAM core 4B is formed in the pseudo SRAM 4F. The other structures of this fourteenth embodiment are identical to those of the eleventh embodiment.

The present embodiment can provide similar effects to those of the foregoing first and ninth embodiments.

The foregoing seventh embodiment was described as an example where the SIP was formed by mounting the logic chip 2, the flash memory 3 and the pseudo SRAM 4 on the system board 1. The present invention is not limited to such an embodiment. For example, an SIP may be formed by stacking the flash memory and pseudo SRAM on the logic chip. Instead, the present invention may be applied to an MCP in which the logic chip 2, the flash memory 3 and the pseudo SRAM 4 are mounted.

The invention is not limited to the above embodiments and various modifications may be made without departing from the spirit and scope of the invention. Any improvement may be made in part or all of the components.

What is claimed:

1. A semiconductor device comprising a logic chip and a memory chip to be accessed by said logic chip mounted in a single package, said logic chip includes:

a mode selecting terminal for receiving a mode selecting signal supplied from an exterior of the semiconductor device to select one of a first and second test modes for testing said memory chip;

a pattern generator for operating during said first test mode to generate internal test pattern(s) for said memory chip;

a test result terminal for outputting, to the exterior of the semiconductor device, a result of a test executed according to said internal test pattern;

a first multipurpose terminal serving as a test terminal during said second test mode and serving as a normal terminal during a normal operation, the first multipurpose terminal connected to the exterior of the semiconductor device; and a pattern selector for selecting, during said first test mode, said internal test pattern(s) outputted from said pattern generator, for selecting, during said second test mode, an external test pattern supplied via said test terminal, and for outputting the selected test pattern to said memory chip.

2. The semiconductor device according to claim 1, wherein:

said logic chip has a pattern selecting terminal for receiving a pattern selecting signal supplied from the exterior of the semiconductor device; and said pattern generator has a function to generate a plurality of said internal test patterns and outputs one of the internal test patterns in response to said pattern selecting signal.

3. The semiconductor device according to claim 2, wherein two of said internal test patterns are a first test pattern and a second test pattern which is constituted by adding a different test pattern to said first test pattern.

4. The semiconductor device according to claim 2, wherein two of said internal test patterns are a first test pattern not including a dummy write pattern for writing data into memory cells adjacent to a watched memory cell in said memory chip, and a second test pattern including said dummy write pattern.

5. The semiconductor device according to claim 1, wherein:

said logic chip has a timing selecting terminal for receiving a timing selecting signal supplied from the exterior of the semiconductor device;

said memory chip includes memory cells, and bit lines for inputting data to and outputting data from said memory cells; and said pattern generator includes a precharge control circuit for varying, in accordance with said timing selecting signal, a time period from the end of writing data into said memory cells until a start of precharging said bit lines.

6. The semiconductor device according to claim 1, wherein:

said logic chip has a timing selecting terminal for receiving a timing selecting signal supplied from the exterior of the semiconductor device;

said memory chip includes volatile memory cells each having a capacitor for holding data; and said pattern generator includes a refresh control circuit for varying, in accordance with said timing selecting signal, intervals at which refresh operations for said memory cells are executed.

7. The semiconductor device according to claim 1, wherein said logic chip has:

a fail mode terminal for receiving a fail mode signal supplied from the exterior of the semiconductor device; and a fail mode selector for selecting, during said first test mode, in accordance with said fail mode signal.

8. The semiconductor device according to claim 7, wherein said logic chip has a second multipurpose terminal serving as a test item terminal during said first test mode and serving as said normal terminal during said normal operation, the second multipurpose terminal connected to the exterior of the semiconductor device, said test item terminal outputting test items to be sequentially executed according to said internal test pattern.

9. The semiconductor device according to claim 1, wherein said logic chip has:

a pattern changing terminal for receiving a pattern changing signal supplied from the exterior of the semiconductor device;

a pattern changing circuit for changing expected data in accordance with said pattern changing signal; and a data comparator for receiving correct or incorrect expected data outputted from said pattern changing circuit in accordance with said pattern changing signal, for comparing the received data with data read from said memory chip, and for outputting the comparison result as said test result.

10. A semiconductor device comprising:

a memory connection terminal connected to a terminal of memory chip mounted in a same package as the semiconductor device;

a mode selecting terminal for receiving a mode selecting signal supplied from an exterior of the semiconductor device to select one of a first and second test modes for testing said memory chip;

a pattern generator operating during said first test mode to generate an internal test pattern for said memory chip;

a test result terminal for outputting, to the exterior of the semiconductor device, a result of a test executed according to said internal test pattern;

a multipurpose terminal serving as a test terminal during said second test mode and serving as a normal terminal during a normal operation, the multipurpose terminal connected to the exterior of the semiconductor device; and a pattern selector for selecting, during said first test mode, said internal test pattern outputted from said pattern generator, for selecting, during said second test mode, an external test pattern supplied via said test terminal, and for outputting the selected test pattern to said memory chip.

* * * * *